United States Patent
Chin et al.

(10) Patent No.: US 11,979,086 B2
(45) Date of Patent: May 7, 2024

(54) RESONANT CONVERSION SYSTEM AND CONTROL METHOD

(71) Applicant: Huawei Digital Power Technologies Co., Ltd., Shenzhen (CN)

(72) Inventors: Ken Chin, Shenzhen (CN); Yuanjun Liu, Shenzhen (CN); Zhixiang Hu, Dongguan (CN); Shuaibing Wang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 235 days.

(21) Appl. No.: 17/750,645

(22) Filed: May 23, 2022

(65) Prior Publication Data

US 2022/0385175 A1  Dec. 1, 2022

(30) Foreign Application Priority Data

May 27, 2021 (CN) .......................... 202110583363.2

(51) Int. Cl.
*H02M 3/10* (2006.01)
*G01R 19/12* (2006.01)
(Continued)

(52) U.S. Cl.
CPC .............. *H02M 3/01* (2021.05); *G01R 19/12* (2013.01); *H02M 1/0009* (2021.05); *H02M 1/0058* (2021.05)

(58) Field of Classification Search
CPC ...... H02M 3/01; H02M 3/015; H02M 1/0003; H02M 1/0009; H02M 1/0054; H02M 1/0058; G01R 19/12
See application file for complete search history.

(56) References Cited

U.S. PATENT DOCUMENTS 9,525,358 B2 * 12/2016 Jin .......................... H02M 1/38
9,634,572 B2 *  4/2017 Jin .......................... H02M 3/01
(Continued)

FOREIGN PATENT DOCUMENTS

CN    101164221 A    4/2008
CN    101471606 A    7/2009
(Continued)

OTHER PUBLICATIONS

Simone et al., "Design-oriented steady state analysis of LLC resonant converters based on FHA", Speedam, 2006, 8 pages.

*Primary Examiner* — Adolf D Berhane
(74) *Attorney, Agent, or Firm* — Maier & Maier, PLLC

(57) ABSTRACT

This application provides a resonant conversion system, including a controller and a resonant conversion circuit. The resonant conversion circuit includes a high frequency chopper circuit, a resonant cavity, a transformer, and a rectification filter network, and the high frequency chopper circuit includes switches S1 and S2. The controller is configured to: detect a bridge arm midpoint voltage $V_{SW}$, and determine based on the $V_{SW}$ a current threshold signal used to indicate a current threshold; detect a resonant current on a primary side of the transformer, and compare the resonant current with the current threshold signal to control on/off of the switch S1 or S2 based on the second electrical signal, so that the system operates in an inductive mode to ensure zero voltage switching of the switch, while operating in a state close to a capacitive mode to maximize the use of a gain region.

13 Claims, 12 Drawing Sheets

(51) Int. Cl.
*H02M 1/00* (2006.01)
*H02M 3/00* (2006.01)

(56) References Cited

U.S. PATENT DOCUMENTS

| | | | |
|---|---|---|---|
| 10,374,516 B2 * | 8/2019 | Moon | H02M 1/32 |
| 10,693,379 B2 * | 6/2020 | Moon | H02M 3/01 |
| 2011/0187335 A1 | 8/2011 | Grakist et al. | |
| 2016/0087543 A1 | 3/2016 | Jin et al. | |
| 2016/0087544 A1 | 3/2016 | Jin et al. | |
| 2019/0044434 A1 | 2/2019 | Elferich et al. | |
| 2024/0072676 A1 * | 2/2024 | Ishibashi | H02M 3/33576 |

FOREIGN PATENT DOCUMENTS

| | | |
|---|---|---|
| CN | 104270008 A | 1/2015 |
| CN | 204089601 U | 1/2015 |
| CN | 104539165 A | 4/2015 |
| CN | 105207487 A | 12/2015 |
| CN | 105375768 A | 3/2016 |
| CN | 108123603 A | 6/2018 |
| CN | 110588395 A | 12/2019 |
| CN | 112803774 A | 5/2021 |
| CN | 113452254 A | 9/2021 |
| EP | 1869758 B1 | 10/2012 |
| EP | 2201669 B1 | 6/2017 |
| WO | 2016177189 A1 | 11/2016 |
| WO | 2018097820 A1 | 5/2018 |

\* cited by examiner

RESONANT CONVERSION SYSTEM AND CONTROL METHOD

CROSS-REFERENCE TO RELATED APPLICATION

This application claims priority to Chinese Patent Application No. 202110583363.2, filed on May 27, 2021, which is hereby incorporated by reference in its entirety.

TECHNICAL FIELD

This application relates to the field of switching converter technologies, and more specifically, to a resonant conversion system and a control method.

BACKGROUND

With rapid development of the electronics and electric power field, switching converters are widely used. To improve efficiency of a converter, soft switching of the converter is usually required. A resonant-type soft switching topology enables soft switching control by using a zero voltage switching (ZVS) technology.

A half-bridge LLC usually adopts pulse frequency modulation (PFM) control. Specifically, in one period with dead time being ignored, turn-on time of a switching transistor S1 and a switching transistor S2 each occupies 50% of the period, and an input and output voltage gain of a resonant cavity is changed by adjusting a switching frequency fs, to adjust an output voltage. Based on a resonant frequency, a gain curve may be divided into an inductive region and a capacitive region. To implement zero voltage switching of the switching transistors, the half-bridge LLC needs to operate in the inductive region. If the half-bridge LLC operates in the capacitive region, ZVS cannot be implemented, and a risk that a shoot-through current is generated between S1 and S2 may occur. To avoid entering a capacitive mode, a conventional manner usually adopts a frequency limiting method to limit a lowest operating frequency to make an operating frequency greater than fm. However, under some abnormal conditions, such as an output short circuit and overload, the frequency limiting method fails and the entire system operates in the capacitive region. Consequently, zero voltage switching of a switch cannot be implemented.

Therefore, a resonant conversion system is urgently needed to keep the system operating in an inductive mode and ensure the zero voltage switching of the switch.

SUMMARY

This application provides a resonant conversion system and a control method, so that the system continuously operates in an inductive mode to ensure zero voltage switching of a switch, while operating in a state close to a capacitive mode to maximize the use of a gain region.

According to a first aspect, a resonant conversion system is provided, including a controller and a resonant conversion circuit. The resonant conversion circuit includes a high frequency chopper circuit, a resonant cavity, a transformer, and a rectification filter network, and the high frequency chopper circuit includes switches S1 and S2. The controller is configured to control on/off of the switches S1 and S2 to convert a direct current voltage input to the high frequency chopper circuit into a high frequency square wave. The resonant cavity and the transformer are configured to receive the high frequency square wave and couple electrical energy from a primary side of the transformer to a secondary side. The rectification filter network is configured to convert an alternating current voltage coupled to the secondary side of the transformer into a direct current voltage. The controller is further configured to detect a bridge arm midpoint voltage $V_{SW}$, and determine a first electrical signal based on the bridge arm midpoint voltage $V_{SW}$, where the bridge arm midpoint voltage $V_{SW}$ is a voltage of a bridge arm midpoint connected to the switches S1 and S2, and the first electrical signal has an association relationship with a slope of the bridge arm midpoint voltage $V_{SW}$; determine a current threshold signal based on the first electrical signal, where the current threshold signal is used to indicate a current threshold; detect a resonant current on a primary side of the transformer and compare the resonant current with the current threshold signal to determine a second electrical signal, where the second electrical signal is used to indicate a comparison result; and control on/off of the switch S1 or S2 based on the second electrical signal, so that the system operates in an inductive mode.

According to the technical solution of this application, a change of the bridge arm midpoint voltage is detected to adaptively adjust the current threshold and perform capacitive protection, so that the system continuously operates in the inductive mode to satisfy zero voltage switching of the switch, while the system may operate in a state close to a capacitive mode to maximize the use of a gain region.

With reference to the first aspect, in some implementations of the first aspect, the first electrical signal includes a first pulse signal slp1 and a second pulse signal slp2, and the controller is specifically configured to:

detect the bridge arm midpoint voltage $V_{SW}$, and determine a slope signal $V_{SLP}$ based on the bridge arm midpoint voltage $V_{SW}$, where the slope signal $V_{SLP}$ indicates the slope of the bridge arm midpoint voltage $V_{SW}$; determine a first pulse signal slp1 based on the slope signal $V_{SLP}$ and a first slope threshold $V_{TH1}$, where a pulse length of the first pulse signal slp1 is used to indicate duration tslp1 in which the slope signal $V_{SLP}$ is greater than the first slope threshold $V_{TH1}$; and determine a second pulse signal slp2 based on the slope signal $V_{SLP}$ and a second slope threshold $V_{TH2}$, where a pulse length of the second pulse signal slp2 is used to indicate duration tslp2 in which the slope signal $V_{SLP}$ is less than the second slope threshold $V_{TH2}$, and the second slope threshold $V_{TH2}$ is less than the first slope threshold $V_{TH1}$.

With reference to the first aspect, in some implementations of the first aspect, the current threshold signal includes a first current threshold signal used to indicate a first current threshold ith1 and a second current threshold signal used to indicate a second current threshold ith2, and the controller is further configured to: determine the first current threshold signal and the second current threshold signal based on the first pulse signal slp1 and the second pulse signal slp2, where the controller is specifically configured to:

determine a first initial current threshold and a second initial current threshold, where the first initial current threshold is a positive value, and the second initial current threshold is a negative value;
compare the duration tslp1 indicated by the pulse length of the first pulse signal with a first time threshold Tth1, and when the duration tslp1 indicated by the pulse length of the first pulse signal is greater than the first time threshold Tth1, decrease the first initial current threshold to obtain the first current threshold ith1, or when the duration tsl1 indicated by the pulse length of the first pulse signal is less than the first time threshold Tth1, increase the first initial current threshold to obtain the first current threshold ith1; and compare the duration tslp2 indicated by the pulse length of the second pulse signal with a second time threshold Tth2, and when the duration tslp2 indicated by the pulse length of the second pulse signal is greater than the second time threshold Tth2, increase the second initial current threshold to obtain the second current threshold ith2, or when the duration tslp2 indicated by the pulse length of the second pulse signal is less than the second time threshold Tth2, decrease the second initial current threshold to obtain the second current threshold ith2.

According to the technical solution of this application, the change of the bridge arm midpoint voltage is detected to determine duration indicated by a pulse length of a pulse signal, adaptively adjust the current threshold, and perform capacitive protection, so that the system continuously operates in the inductive mode to satisfy zero voltage switching of the switch, while the system may operate in the state close to the capacitive mode to maximize the use of the gain region.

With reference to the first aspect, in another implementation of the first aspect, the first electrical signal is the slope signal $V_{SLP}$, the slope signal $V_{SLP}$ indicates the slope of the bridge arm midpoint voltage $V_{SW}$, and a slope detection circuit is specifically configured to:

detect the bridge arm midpoint voltage $V_{SW}$, and output the slope signal $V_{SLP}$ based on the bridge arm midpoint voltage $V_{SW}$.

With reference to the first aspect, in another implementation of the first aspect, the current threshold signal includes the first current threshold signal used to indicate the first current threshold ith1 and the second current threshold signal used to indicate the second current threshold ith2, and the controller is further configured to: determine the first current threshold signal and the second current threshold signal based on the slope signal $V_{SLP}$, where the controller is specifically configured to:

determine the first initial current threshold and the second initial current threshold, where the first initial current threshold is a positive value, and the second initial current threshold is a negative value;

compare the slope signal $V_{SLP}$ with a third slope threshold $V_{TH3}$, and when the slope signal $V_{SLP}$ is greater than the third slope threshold $V_{TH3}$, decrease the first initial current threshold to obtain the first current threshold ith1, or when the slope signal $V_{SLP}$ is less than the third slope threshold $V_{TH3}$, increase the first initial current threshold to obtain the first current threshold ith1; and compare the slope signal $V_{SLP}$ with a fourth slope threshold $V_{TH4}$, and when the slope signal $V_{SLP}$ is greater than the fourth slope threshold $V_{TH4}$, increase the second initial current threshold to obtain the second current threshold ith2, or when the slope signal $V_{SLP}$ is less than the fourth slope threshold $V_{TH4}$, decrease the second initial current threshold to obtain the second current threshold ith2, where the fourth slope threshold $V_{TH4}$ is less than the third slope threshold $V_{TH3}$.

According to the technical solution of this application, the change of the bridge arm midpoint voltage is detected to determine a speed at which the voltage changes, adaptively adjust the current threshold, and perform capacitive protection, so that the system continuously operates in the inductive mode to satisfy zero voltage switching of the switch, while the system may operate in the state close to the capacitive mode to maximize the use of the gain region.

With reference to the first aspect, in an implementation of the first aspect, the second electrical signal includes a first switching signal ic1 and a second switching signal ic2, and the controller is further configured to: detect the resonant current icr on the primary side of the transformer, and output the first switching signal ic1 and the second switching signal ic2 based on the resonant current icr and the current threshold signal, where the current threshold signal includes the first current threshold signal used to indicate the first current threshold ith1 and the second current threshold signal used to indicate the second current threshold ith2, and the controller is specifically configured to:

compare the resonant current icr with the first current threshold ith1, and when the resonant current icr is greater than the first current threshold ith1, determine that the first switching signal ic1 is used to indicate to turn on the switch S1, or when the resonant current icr is less than the first current threshold ith1, determine that the first switching signal ic1 is used to indicate to turn off the switch S1; and compare the resonant current icr with the second current threshold ith2, and when the resonant current icr is greater than the second current threshold ith2, determine that the second switching signal ic2 is used to indicate to turn off the switch S2, or when the resonant current icr is less than the second current threshold ith2, determine that the second switching signal ic2 is used to indicate to turn on the switch S2.

With reference to the first aspect, in an implementation of the first aspect, the controller is specifically configured to: determine a first control signal DRV1 based on the first switching signal ic1, where the first control signal DRV1 is used to control on/off of the switch S1; and determine a second control signal DRV2 based on the second switching signal ic2, where the second control signal DRV2 is used to control on/off of the switch S2.

In a possible implementation, the controller includes a slope detection circuit, a threshold control circuit, a current comparison circuit, and a switching control circuit.

Optionally, in this embodiment of this application, the slope detection circuit includes a detection capacitor Csw and a detection resistor Rsw.

A first end of the detection capacitor Csw is configured to receive the bridge arm midpoint voltage Vsw, a second end of the detection capacitor Csw is connected to a first end of the detection resistor Rsw, a second end of the detection resistor Rsw is grounded, and the first end of the detection resistor Rsw is configured to output the slope signal $V_{SLP}$.

Optionally, in this embodiment of this application, the slope detection circuit further includes a first comparator CMP1, a second comparator CMP2, and a first NOT gate INV1.

A first input end and a second input end of the first comparator CMP1 are configured to receive the slope signal $V_{SLP}$ and a signal of the first slope threshold $V_{TH1}$ respectively, and an output end of the first comparator CMP1 is configured to output the first pulse signal slp1. A first input end and a second input end of the second comparator CMP2 are configured to receive the slope signal $V_{SLP}$ and a signal of the second slope threshold $V_{TH2}$ respectively, an output end of the second comparator CMP2 is connected to an input end of the first NOT gate INV1, and an output end of the first NOT gate INV1 is configured to output the second pulse signal slp2.

Optionally, in this embodiment of this application, the current comparison circuit includes a third comparator CMP3, a fourth comparator CMP4, and a second NOT gate INV2.

A first input end and a second input end of the third comparator CMP3 are configured to receive the resonant current icr and the first current threshold ith1 respectively, and an output end of the third comparator CMP3 is configured to output the first switching signal ic1. A first input end and a second input end of the fourth comparator CMP4 are configured to receive the resonant current icr and the second current threshold ith2 respectively, an output end of the fourth comparator CMP4 is connected to an input end of the second NOT gate INV2, and an output end of the second NOT gate INV2 is configured to output the second switching signal ic2.

According to a second aspect, a method for controlling a resonant conversion system is provided. The resonant conversion system includes a controller and a resonant conversion circuit. The resonant conversion circuit includes a high frequency chopper circuit, a resonant cavity, a transformer, and a rectification filter network, and the high frequency chopper circuit includes switches S1 and S2. The controller is configured to control on/off of the switches S1 and S2 to convert a direct current voltage input to the high frequency chopper circuit into a high frequency square wave. The resonant cavity and the transformer are configured to receive the high frequency square wave and couple electrical energy from a primary side of the transformer to a secondary side. The rectification filter network is configured to convert an alternating current voltage coupled to the secondary side of the transformer into a direct current voltage. The method includes: The controller detects a bridge arm midpoint voltage $V_{SW}$, and determines a first electrical signal based on the bridge arm midpoint voltage $V_{SW}$, where the bridge arm midpoint voltage $V_{SW}$ is a voltage of a bridge arm midpoint connected to the switches S1 and S2, and the first electrical signal has an association relationship with a slope of the bridge arm midpoint voltage Vsw; the controller determines a current threshold signal based on the first electrical signal, where the current threshold signal is used to indicate a current threshold; the controller detects a resonant current on a primary side of the transformer and compares the resonant current with the current threshold signal to determine a second electrical signal, where the second electrical signal is used to indicate a comparison result; and the controller controls on/off of the switch S1 or S2 based on the second electrical signal, so that the system operates in an inductive mode.

According to the technical solution of this application, a change of the bridge arm midpoint voltage is detected to adaptively adjust the current threshold and perform capacitive protection, so that the system continuously operates in the inductive mode to satisfy zero voltage switching of the switch, while the system may operate in a state close to a capacitive mode to maximize the use of a gain region.

With reference to the second aspect, in some implementations of the second aspect, the first electrical signal includes a first pulse signal slp1 and a second pulse signal slp2, and that the controller detects a bridge arm midpoint voltage $V_{SW}$, and determines a first electrical signal based on the bridge arm midpoint voltage $V_{SW}$ includes:

The controller detects the bridge arm midpoint voltage $V_{SW}$, and determines a slope signal $V_{SLP}$ based on the bridge arm midpoint voltage $V_{SW}$, where the slope signal $V_{SLP}$ indicates the slope of the bridge arm midpoint voltage $V_{SW}$.

The controller determines the first pulse signal slp1 based on the slope signal $V_{SLP}$ and a first slope threshold $V_{TH1}$, where a pulse length of the first pulse signal slp1 is used to indicate duration tslp1 in which the slope signal $V_{SLP}$ is greater than the first slope threshold $V_{TH1}$.

The controller determines the second pulse signal slp2 based on the slope signal $V_{SLP}$ and a second slope threshold $V_{TH2}$, where a pulse length of the second pulse signal slp2 is used to indicate duration tslp2 in which the slope signal $V_{SLP}$ is less than the second slope threshold $V_{TH2}$, and the second slope threshold $VTH_2$ is less than the first slope threshold $V_{TH1}$.

With reference to the second aspect, in some implementations of the second aspect, the current threshold signal includes a first current threshold signal used to indicate a first current threshold ith1 and a second current threshold signal used to indicate a second current threshold ith2, and that the controller determines a current threshold signal based on the first electrical signal includes: The controller determines the first current threshold signal and the second current threshold signal based on the first pulse signal slp1 and the second pulse signal slp2.

That the controller determines the first current threshold signal and the second current threshold signal based on the first pulse signal slp1 and the second pulse signal slp2 includes:

The controller determines a first initial current threshold and a second initial current threshold, where the first initial current threshold is a positive value, and the second initial current threshold is a negative value.

The controller compares the duration tslp1 indicated by the pulse length of the first pulse signal with a first time threshold Tth1, and when the duration tslp1 indicated by the pulse length of the first pulse signal slp1 is greater than the first time threshold Tth1, the controller decreases the first initial current threshold to obtain the first current threshold ith1, or when the duration tslp1 indicated by the pulse length of the first pulse signal slp1 is less than the first time threshold Tth1, the controller increases the first initial current threshold to obtain the first current threshold ith1.

The controller compares the duration tslp2 indicated by the pulse length of the second pulse signal with a second time threshold Tth2, and when the duration tslp2 indicated by the pulse length of the second pulse signal slp2 is greater than the second time threshold Tth2, the controller increases the second initial current threshold to obtain the second current threshold ith2, or when the duration tslp2 indicated by the pulse length of the second pulse signal slp2 is less than the second time threshold Tth2, the controller decreases the second initial current threshold to obtain the second current threshold ith2.

According to the technical solution of this application, the change of the bridge arm midpoint voltage is detected to determine duration indicated by a pulse length of a pulse signal, adaptively adjust the current threshold, and perform capacitive protection, so that the system continuously operates in the inductive mode to satisfy zero voltage switching of the switch, while the system may operate in the state close to the capacitive mode to maximize the use of the gain region.

With reference to the second aspect, in some other implementations of the second aspect, the first electrical signal is the slope signal $V_{SLP}$, the slope signal $V_{SLP}$ indicates the slope of the bridge arm midpoint voltage $V_{SW}$, and that the controller detects a bridge arm midpoint voltage $V_{SW}$, and determines a first electrical signal based on the bridge arm midpoint voltage $V_{SW}$ includes: The controller detects the bridge arm midpoint voltage $V_{SW}$, and determines the slope signal $V_{SLP}$ based on the bridge arm midpoint voltage $V_{SW}$.

With reference to the second aspect, in some other implementations of the second aspect, the current threshold signal includes the first current threshold signal used to indicate the first current threshold ith1 and the second current threshold signal used to indicate the second current threshold ith2, and that the controller determines a current threshold signal based on the first electrical signal includes: The controller determines the first current threshold signal and the second current threshold signal based on the slope signal $V_{SLP}$.

That a threshold control circuit determines the first current threshold signal and the second current threshold signal based on the slope signal $V_{SLP}$ includes:

determining the first initial current threshold and the second initial current threshold, where the first initial current threshold is a positive value, and the second initial current threshold is a negative value.

The controller compares the slope signal $V_{SLP}$ with a third slope threshold $V_{TH3}$, and when the slope signal $V_{SLP}$ is greater than the third slope threshold $V_{TH3}$, the controller decreases the first initial current threshold to obtain the first current threshold ith1, or when the slope signal $V_{SLP}$ is less than the third slope threshold $V_{TH3}$, the controller increases the first initial current threshold to obtain the first current threshold ith1.

The controller compares the slope signal $V_{SLP}$ with a fourth slope threshold $V_{TH4}$, and when the slope signal $V_{SLP}$ is greater than the fourth slope threshold $V_{TH4}$, the controller increases the second initial current threshold to obtain the second current threshold ith2, or when the slope signal $V_{SLP}$ is less than the fourth slope threshold $V_{TH4}$, the controller decreases the second initial current threshold to obtain the second current threshold ith2, where the fourth slope threshold $V_{TH4}$ is less than the third slope threshold $V_{TH3}$.

According to the technical solution of this application, the change of the bridge arm midpoint voltage is detected to determine a speed at which the voltage changes, adaptively adjust the current threshold, and perform capacitive protection, so that the system continuously operates in the inductive mode to satisfy zero voltage switching of the switch, while the system may operate in the state close to the capacitive mode to maximize the use of the gain region.

With reference to the second aspect, in an implementation of the second aspect, the second electrical signal includes a first switching signal ic1 and a second switching signal ic2, and that the controller detects a resonant current on a primary side of the transformer and compares the resonant current with the current threshold signal to determine a second electrical signal includes: The controller detects the resonant current icr on the primary side of the transformer. The controller determines the first switching signal ic1 and the second switching signal ic2 based on the resonant current icr and the current threshold signal, where the current threshold signal includes the first current threshold signal used to indicate the first current threshold ith1 and the second current threshold signal used to indicate the second current threshold ith2.

That the controller determines the first switching signal ic1 and the second switching signal ic2 based on the resonant current icr and the current threshold signal includes:

The controller compares the resonant current icr with the first current threshold ith1, where when the resonant current icr is greater than the first current threshold ith1, the first switching signal ic1 is used to indicate to turn on the switch S1, or when the resonant current icr is less than the first current threshold ith1, the first switching signal ic1 is used to indicate to turn off the switch S1, and the controller determines the first switching signal ic1.

The controller compares the resonant current icr with the second current threshold ith2, where when the resonant current icr is greater than the second current threshold ith2, the second switching signal ic2 is used to indicate to turn off the switch S2, or when the resonant current icr is less than the second current threshold ith2, the second switching signal ic2 is used to indicate to turn on the switch S2, and the controller determines the second switching signal ic2.

With reference to the second aspect, in an implementation of the second aspect, that the controller controls on/off of the switch S1 or S2 based on the second electrical signal includes: The controller determines a first control signal DRV1 based on the first switching signal ic1, where the first control signal DRV1 is used to control on/off of the switch S1; and the controller determines a second control signal DRV2 based on the second switching signal ic2, where the second control signal DRV2 is used to control on/off of the switch S2.

In a possible implementation, the controller includes a slope detection circuit, a threshold control circuit, a current comparison circuit, and a switching control circuit.

DESCRIPTION OF EMBODIMENTS

The following describes technical solutions in this application with reference to accompanying drawings.

Figure 1A:
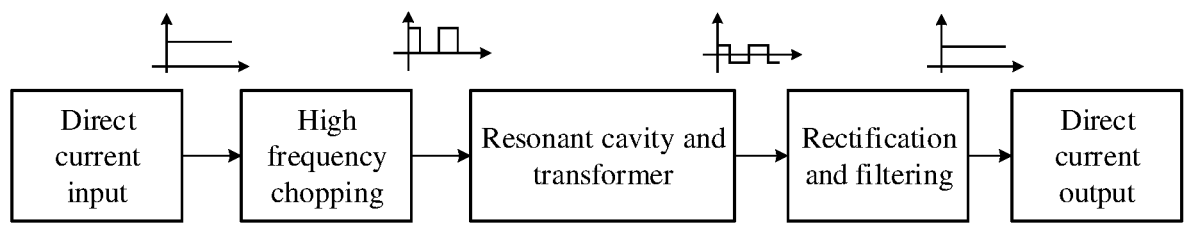
FIG. 1(a) and FIG. 1(b) are a schematic diagram of a DC-DC resonant converter.
Figure 1B:
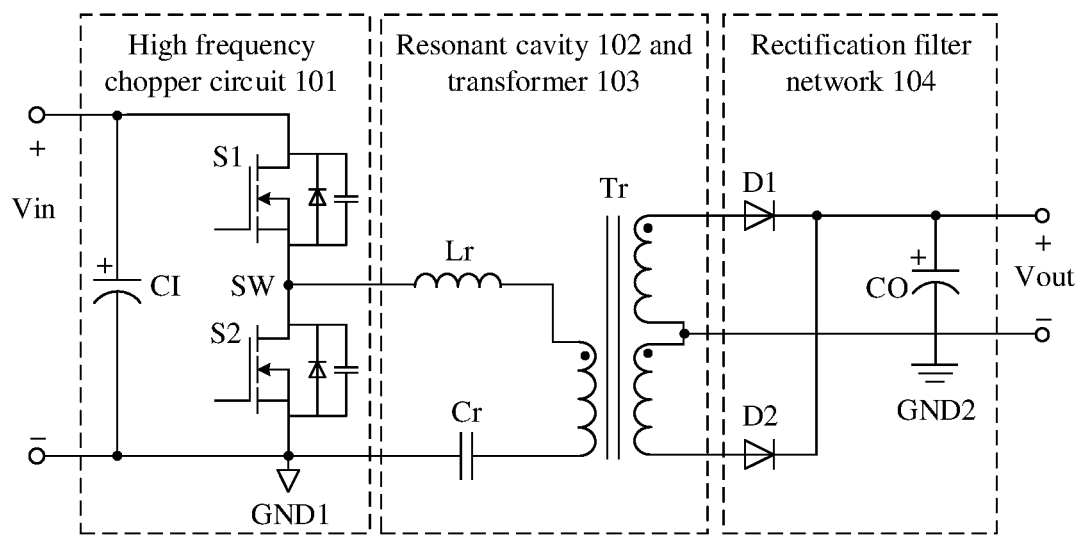
Figure 2:
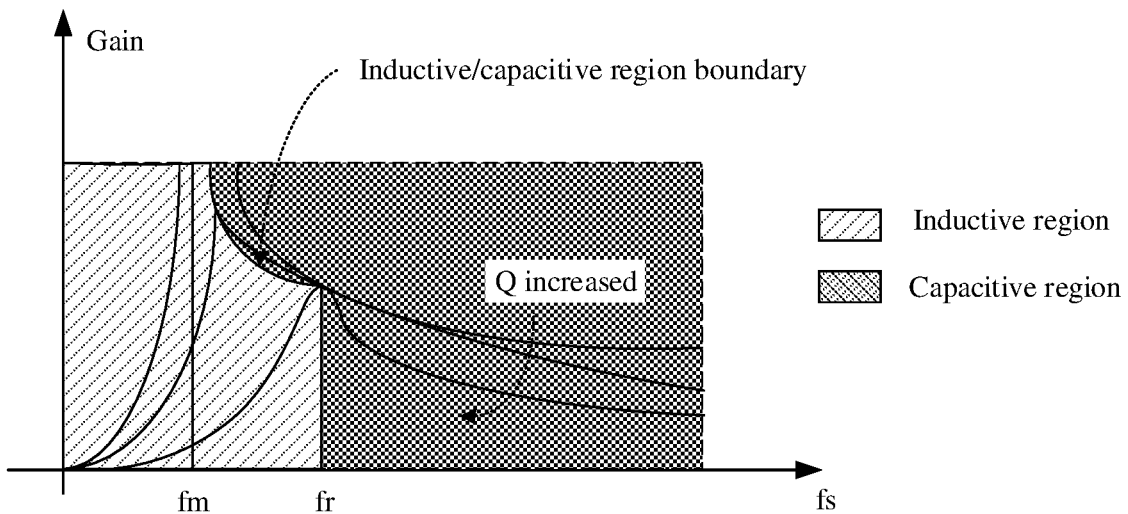
FIG. 2 is a schematic diagram of a half-bridge LLC resonant converter topology 200.

To facilitate understanding of embodiments of this application, the following describes an application scenario of embodiments of this application with reference to FIG. 1(a) and FIG. 1(b) and FIG. 2.

FIG. 1(a) and FIG. 1(b) are a schematic diagram of a typical DC-DC resonant converter. As shown in FIG. 1(a), the resonant converter may perform high frequency chopping on a direct current input to obtain a high frequency square wave, then perform voltage regulation and soft switching through a resonant cavity and a transformer, and finally obtain a required direct current output through rectification and filtering. If a high frequency chopper circuit uses a half-bridge circuit, the resonant cavity is of an LLC type, and the rectification uses diode full wave rectification, a common half-bridge LLC resonant converter topology 100 (half-bridge LLC for short thereafter) shown in FIG. 1(b) is obtained. The resonant converter 100 includes a high frequency chopper circuit 101, a resonant cavity 102, a transformer 103, and a rectification filter network 104. The high frequency chopper circuit 101 includes an input filter capacitor C1, switches S1 and S2 (a diode on the switch is a body diode of the switch, and a capacitor is a parasitic capacitor of the switch). The resonant cavity 102 includes a resonant inductor Lr and a resonant capacitor Cr, where the resonant inductor Lr includes a leakage inductance of the transformer and an external inductance, and may be all integrated into the transformer 103. The transformer 103 may be a transformer Tr, and a primary-side excitation inductance of the transformer is Lm. The rectification filter network 104 includes diodes D1 and D2 and an output filter capacitor CO.

The half-bridge LLC usually adopts pulse frequency modulation (pulse frequency modulation, PFM) control. Specifically, in one period with dead time being ignored, turn-on time of S1 and S2 each occupies 50% of the period, and an input and output voltage gain of the resonant cavity is changed by adjusting a switching frequency fs, to adjust an output voltage. Based on whether the excitation inductance Lm of the transformer participates in a resonance, the resonant cavity obtains two resonant frequencies as follows:

$$fr = \frac{1}{2\pi\sqrt{Lr \cdot Cr}} \quad (1)$$

$$fm = \frac{1}{2\pi\sqrt{(Lr + Lm) \cdot Cr}} \quad (2)$$

Formula (1) represents a resonant frequency obtained when the excitation inductance Lm of the transformer does not participate in the resonance, and formula (2) represents a resonant frequency obtained when the excitation inductance Lm of the transformer participates in the resonance. Based on the resonant frequency, a gain curve may be divided into an inductive region and a capacitive region. As shown in FIG. 2, fm is a frequency of a gain peak point, and is also a boundary point between the capacitive region and the inductive region. When operating at fr, a voltage gain is always 1. To implement zero voltage switching of S1 and S2, the half-bridge LLC needs to operate in the inductive region. If the half-bridge LLC operates in the capacitive region, ZVS cannot be implemented, and a risk that a shoot-through current is generated between S1 and S2 may occur. To avoid entering a capacitive mode, a conventional frequency limiting method is usually adopted to limit a lowest operating frequency to make an operating frequency greater than fm. However, under some abnormal conditions, such as an output short circuit and overload, a value of fm increases when a Q value of the system increases. Consequently, the frequency limiting method fails and the half-bridge LLC operates in the capacitive region.

Figure 3A:
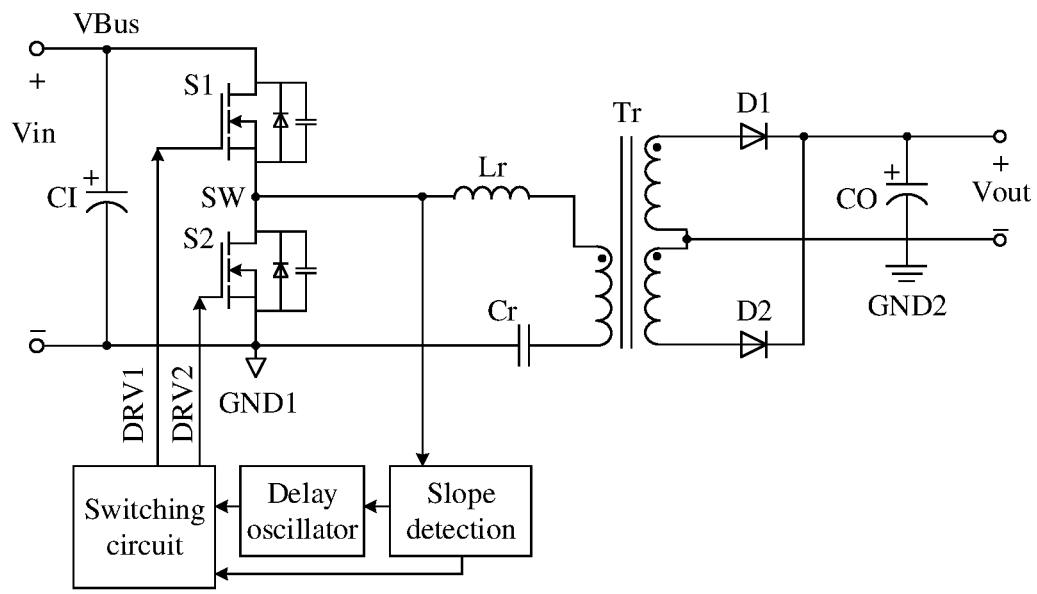
FIG. 3(a), FIG. 3(b), and FIG. 3(c) are a schematic diagram of an inductive region and a capacitive region in which an LLC operates.

When faced with the foregoing technical problem, a conventional technology generally adopts the following processing methods:

(1) A slope detection circuit, a delay oscillator, and a switching circuit are introduced in a conventional half-bridge LLC resonant converter topology. As shown in FIG. 3(a), in a normal state, after S1 or S2 is turned off, an SW point voltage decreases or increases. S1 is used as an example. When S1 is turned on, the SW point voltage is equal to an input voltage Vin; and when S1 is turned off, the SW point voltage decreases from Vin to 0, and then S2 is turned on to implement zero voltage switching. However, if the system enters the capacitive mode, the SW point voltage does not change after S1 is turned off. Therefore, in the conventional technology, the slope detection circuit may detect whether the SW point voltage changes after S1 is turned off to determine whether the circuit enters the capacitive mode. After the circuit determines that the circuit enters the capacitive mode, the delay oscillator performs delay. After a current polarity is normal or oscillator delay time elapses, a switching transistor is turned on. Then, under a condition of ensuring safety, a switching frequency is gradually increased, to avoid the damage to the switching transistor caused by a long-term operation in the capacitive region. However, in this technology, an action is actually started only after the entire system has entered the capacitive mode, and therefore the circuit may be damaged. In addition, because the oscillator delay time is a preset fixed value, the SW point voltage may not decrease to zero after the oscillator delay time ends. As a result, zero voltage switching of the switching transistor cannot be implemented.

Figure 3B:
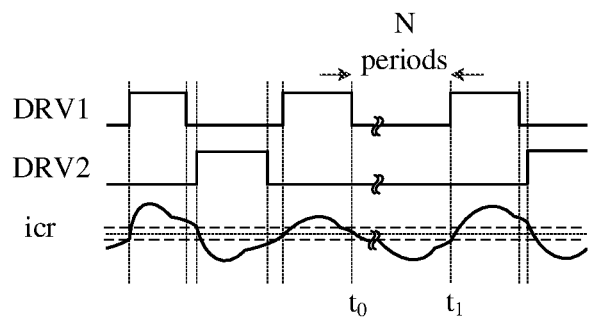

(2) A current comparison circuit and a switching control circuit are introduced in the conventional half-bridge LLC resonant converter topology. A working principle is shown in FIG. 3(b). In the inductive mode, when S1 or S2 is turned off, a resonant current should be greater than a threshold (a positive threshold) or less than a threshold (a negative threshold). S1 is used as an example. When S1 is turned off, the resonant current should be greater than a threshold (a positive threshold). If the current is less than the threshold when S1 is turned off, the system enters the capacitive region at a moment t0 shown in FIG. 3(b). In this topology, the capacitive mode is determined by comparing the resonant current with the threshold. When the capacitive mode is triggered, S1 and S2 are turned off for several periods, for example, a period of time from t0 to t1 shown in the figure, and S1 or S2 is turned on again until a turn-on condition is satisfied (for example, at a moment $t_1$). However, in this technology, the system has no load bearing capacity in the several periods during which S1 and S2 are turned off. In addition, protection is still triggered only after the entire system has entered the capacitive mode, and therefore the circuit may be damaged.

Figure 3C:
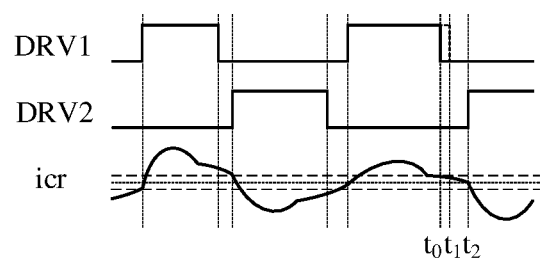

(3) Similar to the principle in (2), this technology performs control by comparing the resonant current with the threshold. A difference in this technology is that, when an absolute value of the resonant current is less than the threshold, S1 or S2 is directly turned off. In this way, the system may operate in a region close to the capacitive mode, and does not enter the capacitive mode due to a threshold limitation. As shown in FIG. 3(c), S1 should be originally turned off at a moment t1. However, as a resonance current icr is lower than the current threshold at a moment t0, S1 is directly turned off, thereby preventing the system from entering the capacitive mode. In actual application, a speed at which the current changes is different under different operating states, and a fixed threshold cannot be optimally controlled. An excessively large threshold leads to a waste of voltage gain margins, and an excessively small threshold cannot ensure reliable implementation of ZVS.

Based on the foregoing reason, this application provides a resonant conversion system, so that the system continuously operates in an inductive mode to ensure zero voltage switching of the switch, while operating in a state close to a capacitive mode to maximize the use of a gain region.

Figure 4:
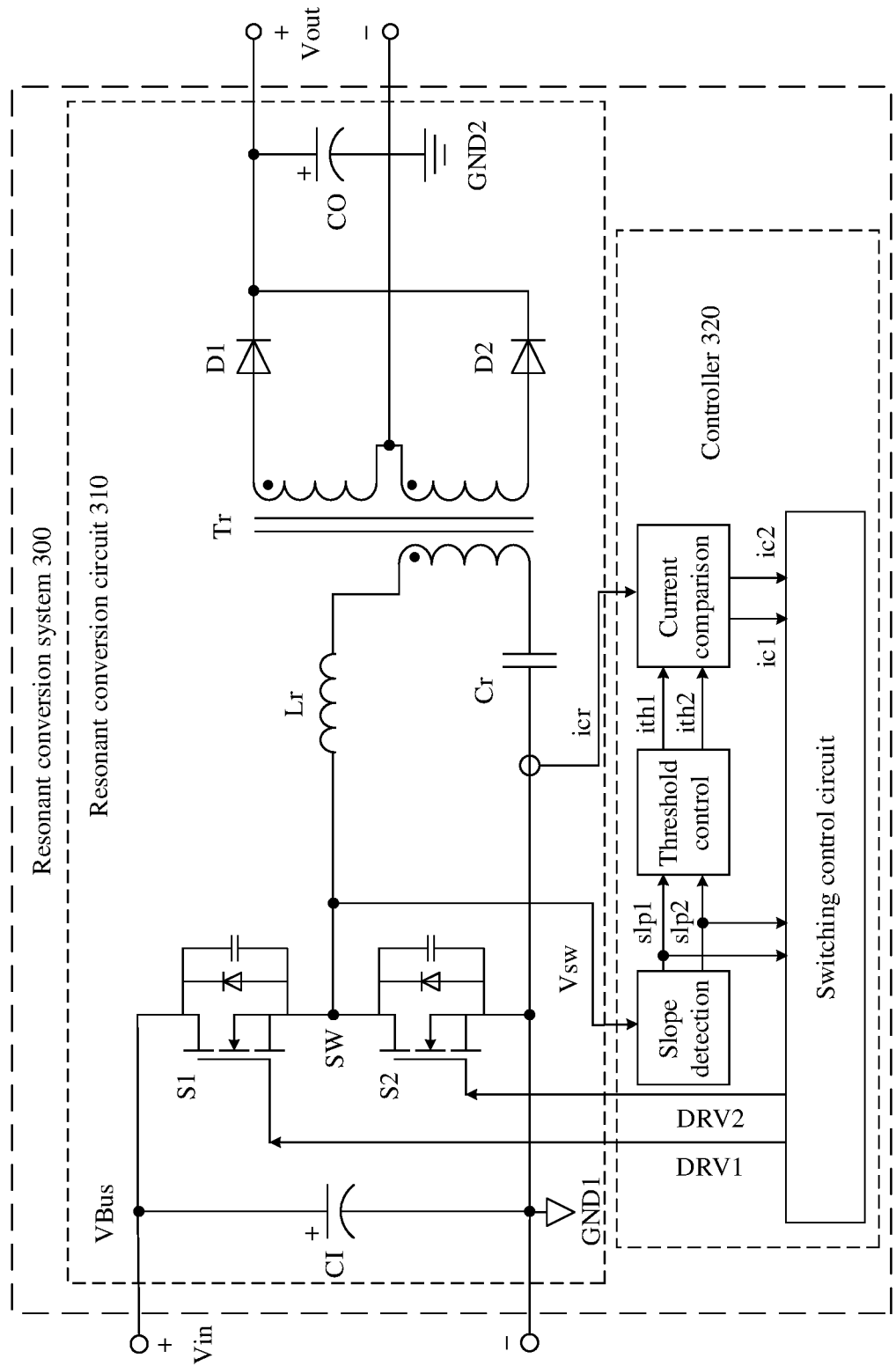
FIG. 4 is a schematic diagram of a structure of a resonant conversion system according to an embodiment of this application.

FIG. 4 is a schematic diagram of a structure of a resonant conversion system according to an embodiment of this application. As shown in FIG. 4, a resonant conversion system 300 includes a resonant conversion circuit 310 and a controller 320. The controller 320 includes a slope detection circuit, a threshold control circuit, a current comparison circuit, and a switching control circuit. The resonant conversion circuit 310 has a similar structure to the resonant converter 100 shown in FIG. 1(b), and details are not described herein again.

It should be understood that switches S1 and S2 in the resonant conversion circuit 310 may be metal-oxide-semiconductor field-effect transistors (metal-oxide-semiconductor field-effect transistor, MOSFET) or insulated gate bipolar transistors (insulated gate bipolar transistor, IGBT) made of materials such as silicon semiconductor materials (silicon, Si), third-generation wide gap semiconductor materials, namely, silicon carbide (silicon carbide, SiC), or gallium nitride (gallium nitride, GaN). This is not limited in this application.

In this embodiment of this application, the controller may detect a bridge arm midpoint voltage through the slope detection circuit, adaptively adjust a current threshold through the threshold control circuit based on a time length indicated by a pulse length of a bridge arm midpoint voltage change signal pulse, and finally control on/off of the switch through the current comparison circuit, to restrict the resonant conversion system from entering the capacitive region. In this way, the system may operate close to the capacitive region, thereby maximizing the use of a gain region.

The following describes this embodiment in detail with reference to FIG. 5(a) and FIG. 5(b), FIG. 6(a) and FIG. 6(b), and FIG. 7(a), FIG. 7(b), FIG. 7(c), and FIG. 7(d).

Figure 5A:
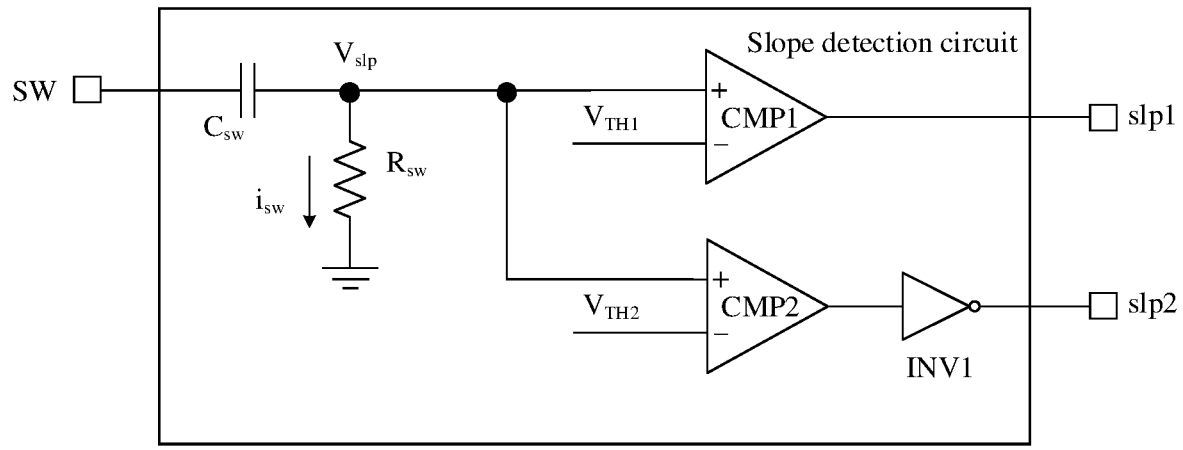
FIG. 5(a) and FIG. 5(b) are a schematic diagram of a structure of a slope detection circuit according to an embodiment of this application.
Figure 5B:
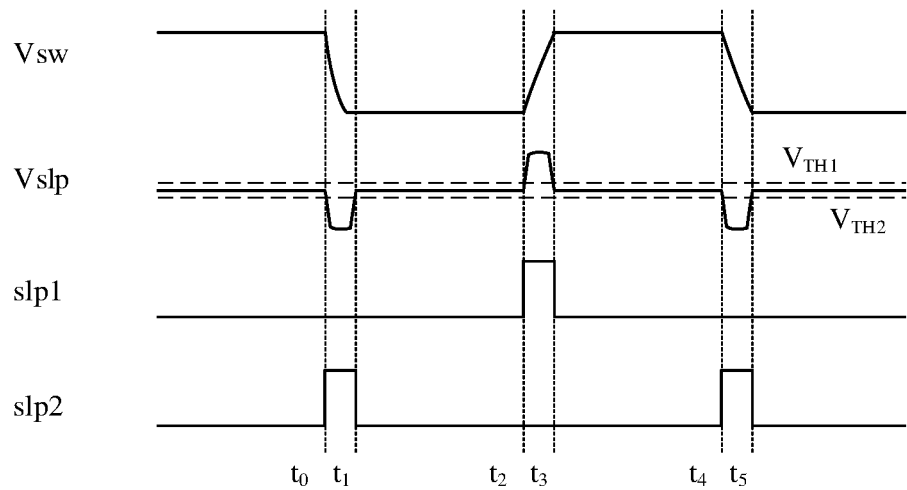

FIG. 5(a) and FIG. 5(b) are a schematic diagram of a structure of a slope detection circuit according to an embodiment of this application. As shown in FIG. 5(a), the slope detection circuit includes a detection capacitor Csw, a detection resistor Rsw, two comparators CMP1 and CMP2, and a NOT gate INV1. A working waveform diagram thereof is shown in FIG. 5(b). From time when a switch S1 is turned off to time when S2 is turned on, the bridge arm midpoint voltage decreases from Vin. Correspondingly, from time when S2 is turned off to time when S1 is turned on, the bridge arm midpoint voltage increases from 0. Therefore, a change at the bridge arm midpoint voltage may be detected through the detection capacitor Csw and the detection resistor Rsw. A change slope Vslp is shown by formula (3):

$$Vslp = Rsw \cdot Csw \cdot \frac{dvsw}{dt} \quad (3)$$

When Vslp is greater than $V_{TH1}$, an output of slp1 is set to 1; and when Vslp is less than $V_{TH2}$, an output of slp2 is set to 1. Therefore, a change of the slope at SW may be detected by using slp1 and slp2. A manner of determining slope thresholds $V_{TH1}$ and $V_{TH2}$ is not limited in this embodiment of this application. For example, a manner such as actual testing, analog simulation, or theoretical calculation may be used. In a possible implementation, dvsw/dt may be obtained based on a magnitude of a resonant current in combination with a resonant capacitor, and values of the thresholds $V_{TH1}$ and $V_{TH2}$ may be obtained based on a slope sampling resistance-capacitance parameter, where $V_{TH2}$ is less than $V_{TH1}$, and optionally $V_{TH1}$ may be a positive value and $V_{TH2}$ may be a negative value.

Figure 6A:
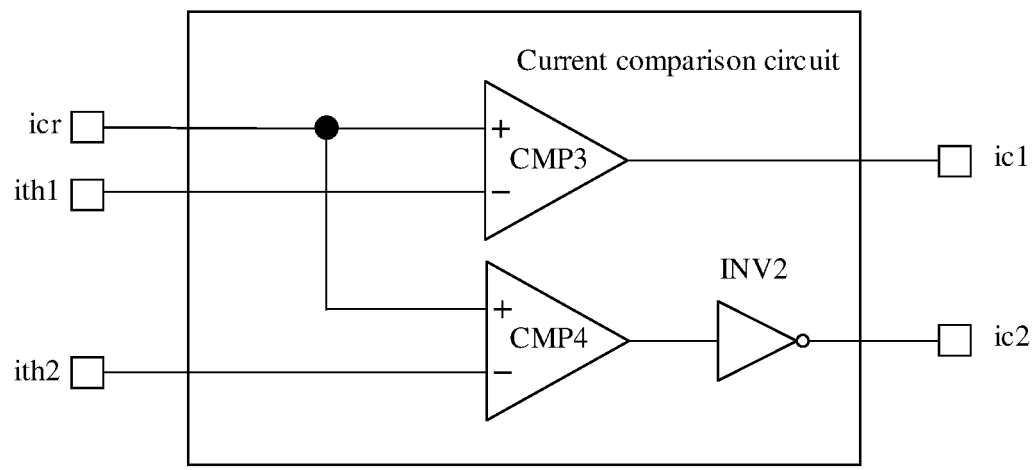
FIG. 6(a) and FIG. 6(b) are a schematic diagram of a structure of a current comparison circuit according to an embodiment of this application.
Figure 6B:
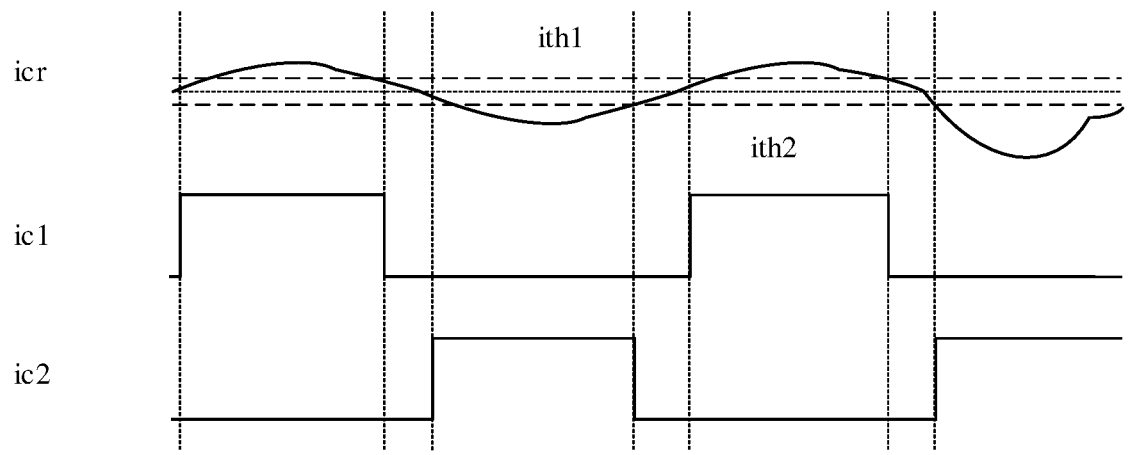

FIG. 6(a) and FIG. 6(b) are a schematic diagram of a structure of a current comparison circuit according to an embodiment of this application. As shown in FIG. 6(a), the current comparison circuit includes two comparators CMP3 and CMP4 and a NOT gate INV2. A waveform diagram thereof is shown in FIG. 6(b). icr is a sampling current of a current of a resonant capacitor Cr. When the current is lower than a threshold ith1, an output of ic1 is changed from 1 to 0; and when icr is greater than ith2, an output of ic2 is changed from 1 to 0. The current comparison circuit is configured to judge the capacitive mode. When S1 is still on, if the output of ic1 is changed from 1 to 0, the capacitive mode is triggered and then S1 is turned off, preventing the system from entering the capacitive mode. Similarly, when S2 is on, if the output of ic2 is changed from 1 to 0, the capacitive mode is triggered and then S2 is turned off. The thresholds ith1 and ith2 are provided by the threshold control circuit.

FIG. 7(a), FIG. 7(b), FIG. 7(c), and FIG. 7(d) are a waveform diagram of a threshold control circuit and a switching control circuit according to an embodiment of this application. A first current threshold ith1 and a second current threshold ith2 are obtained by adjusting a first initial current threshold and a second initial current threshold determined by the threshold control circuit. The first initial current threshold and the second initial current threshold are preset values designed based on a circuit.

Optionally, the first initial current threshold may be a positive value, and the second initial current threshold may be a negative value. With reference to the foregoing manners of determining $V_{TH1}$ and $VTH_2$, the first initial current threshold and the second initial current threshold may be determined in a manner such as actual testing, analog simulation, or theoretical calculation.

Figure 7A:
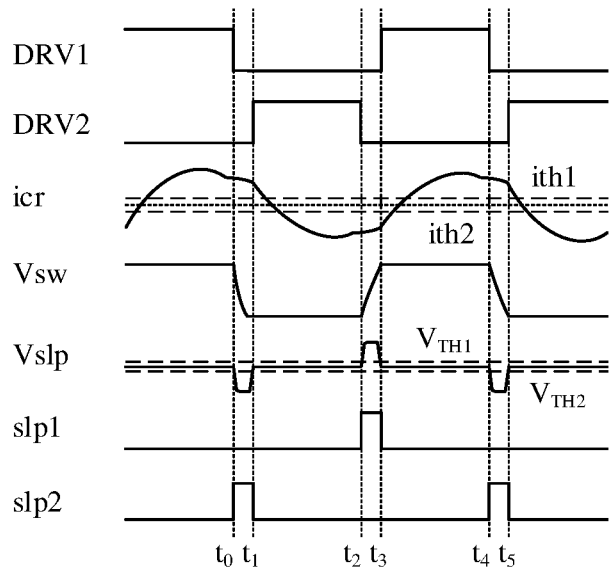
FIG. 7(a), FIG. 7(b), FIG. 7(c), and FIG. 7(d) are a waveform diagram of a threshold control circuit and a switching control circuit according to an embodiment of this application.

In a normal inductive mode, when DRV1 and DRV2 are turned off, icr is greater than the thresholds ith1 and ith2, so that capacitive mode protection is not triggered. As shown in FIG. 7(a), at a moment $t_0$, DRV1 is turned off. In this case, icr is still greater than ith1, and the capacitive mode is not triggered. At a moment $t_1$, slp2 changes from 1 to 0, indicating that a Vsw voltage decreases from Vin to 0. In this case, turning on S2 may implement ZVS. Similarly, at a moment $t_2$, DRV2 is turned off. In this case, icr is still greater than ith2, and the capacitive mode is not triggered. At a moment $t_3$, slp1 changes from 1 to 0, indicating that a Vsw voltage decreases from Vin to 0. In this case, turning on S1 may implement ZVS.

Figure 7B:
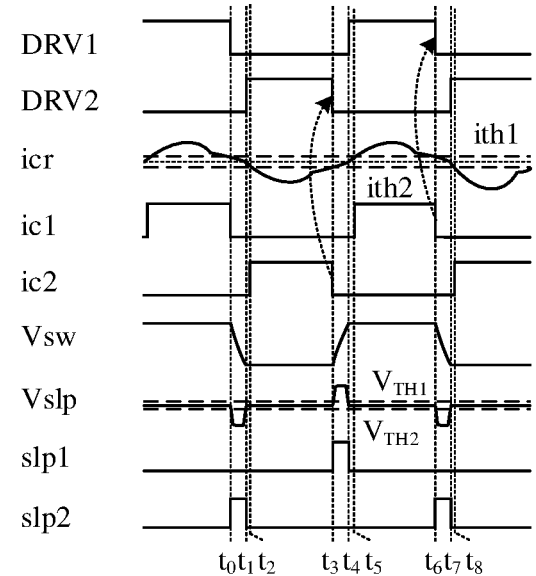

FIG. 7(b) is a waveform diagram of the threshold control circuit and the switching control circuit in a mode close to the capacitive mode. When switching frequencies of the switches S1 and S2 continuously decrease to a frequency close to a resonance frequency fm, in other words, close to the capacitive region, as shown in FIG. 7(b), the resonant current icr is greater than ith2 at a moment $t_3$, and ic2 changes from 1 to 0. In this case, if S2 is turned off, the switching frequencies of S1 and S2 are limited and cannot continue to decrease, and the capacitive region is not be entered. After S2 is turned off, the resonant current icr discharges a capacitor of S1 and charges a capacitor of S2. Then, an SW point voltage rises, and slp1 is obtained through the slope detection circuit.

The threshold control circuit may perform adaptive adjustment of the current thresholds ith1 and ith2 by detecting slp1 (or slp2), to ensure that the system continuously operates in the inductive mode to satisfy zero voltage switching of the switch, while operating in a state close to the capacitive mode to maximize the use of a gain region.

Figure 7C:
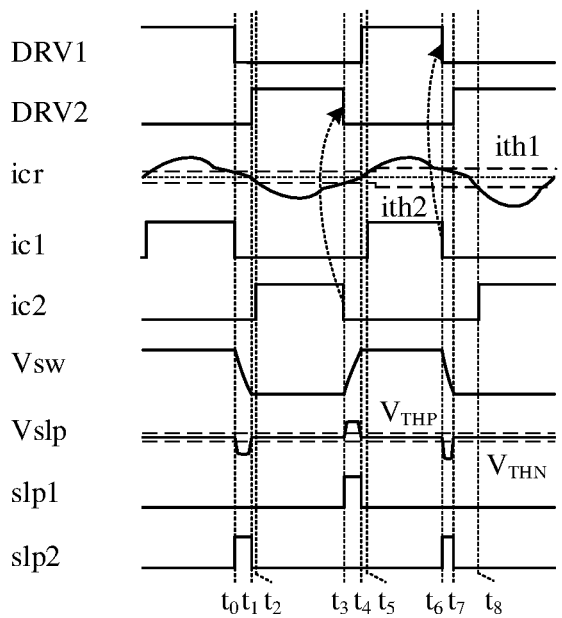

For example, at a moment $t_3$ in FIG. 7(c), if ith2 (an absolute value) is set too small, the sw point voltage Vsw changes slowly, time indicated by a pulse length of slp1 becomes longer, and the gain region cannot be fully utilized. Therefore, the threshold control circuit may detect a time length tslp1 ($t_4$-$t_3$) indicated by the pulse length of slp1. When tslp1 is greater than a time threshold Tth1, the threshold ith2 (an absolute value) is set too small. Therefore, the thresholds ith1 and ith2 (absolute values) are increased. At a moment $t_4$ in FIG. 7(c), it is determined that tslp1 ($t_4$-$t_3$) is greater than the time threshold Tth1, and the control current thresholds ith1 and ith2 (absolute values) are increased. When icr is lower than the current threshold ith1 at a moment $t_6$, the switch is turned off. Because ith1 increases, Vsw changes faster and tslp2 ($t_7$-$t_6$) decreases.

The time threshold Tth1 is a fixed preset value, and may be determined in a manner such as actual testing, analog simulation, or theoretical calculation. A manner of determining the time threshold Tth1 is not limited in this application. The time threshold Tth2 in the following is similar, and details are not described herein again.

Figure 7D:
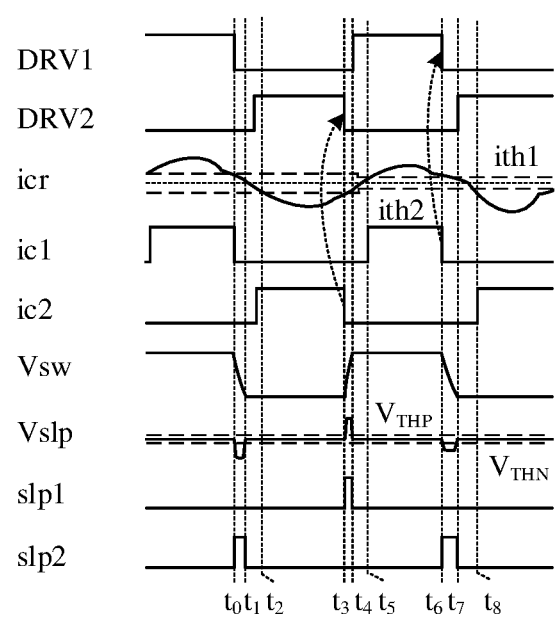

For another example, at a moment $t_3$ in FIG. 7(d), if ith2 (an absolute value) is set too large, the sw point voltage Vsw changes too fast, time indicated by a pulse length of slp2 is very short, and the system may enter the capacitive mode, which is not conducive to implementing zero voltage switching. Therefore, the threshold control circuit detects the time length tslp2 indicated by the pulse length of slp2. When the time tslp2 indicated by the pulse length is less than the time threshold Tth2, it is determined that the current threshold is set too small, and therefore the current thresholds ith1 and ith2 (absolute values) are decreased. At a moment $t_4$ in FIG. 7(d), it is determined that tslp2 ($t_4$-$t_3$) is less than the time threshold Tth2, and the control current thresholds ith1 and ith2 (absolute values) are ecreased. When icr is lower than the current threshold ith1 at a moment $t_6$, the switch is turned off. Because ith1 decreases, Vsw changes slower and tslp2 ($t_7$-$t_6$) increases. In this case, the system may operate close to the capacitive mode, but not enter the capacitive region.

According to the technical solution of this application, the controller may detect the bridge arm midpoint voltage through the slope detection circuit, adaptively adjust the current threshold through the threshold control circuit based on the bridge arm midpoint voltage, and finally control on/off of the switch through the current comparison circuit, to restrict the resonant conversion system from entering the capacitive region. In this way, the system may continuously operate in the inductive region, to implement zero voltage switching and maximize the use of the gain region.

Figure 8:
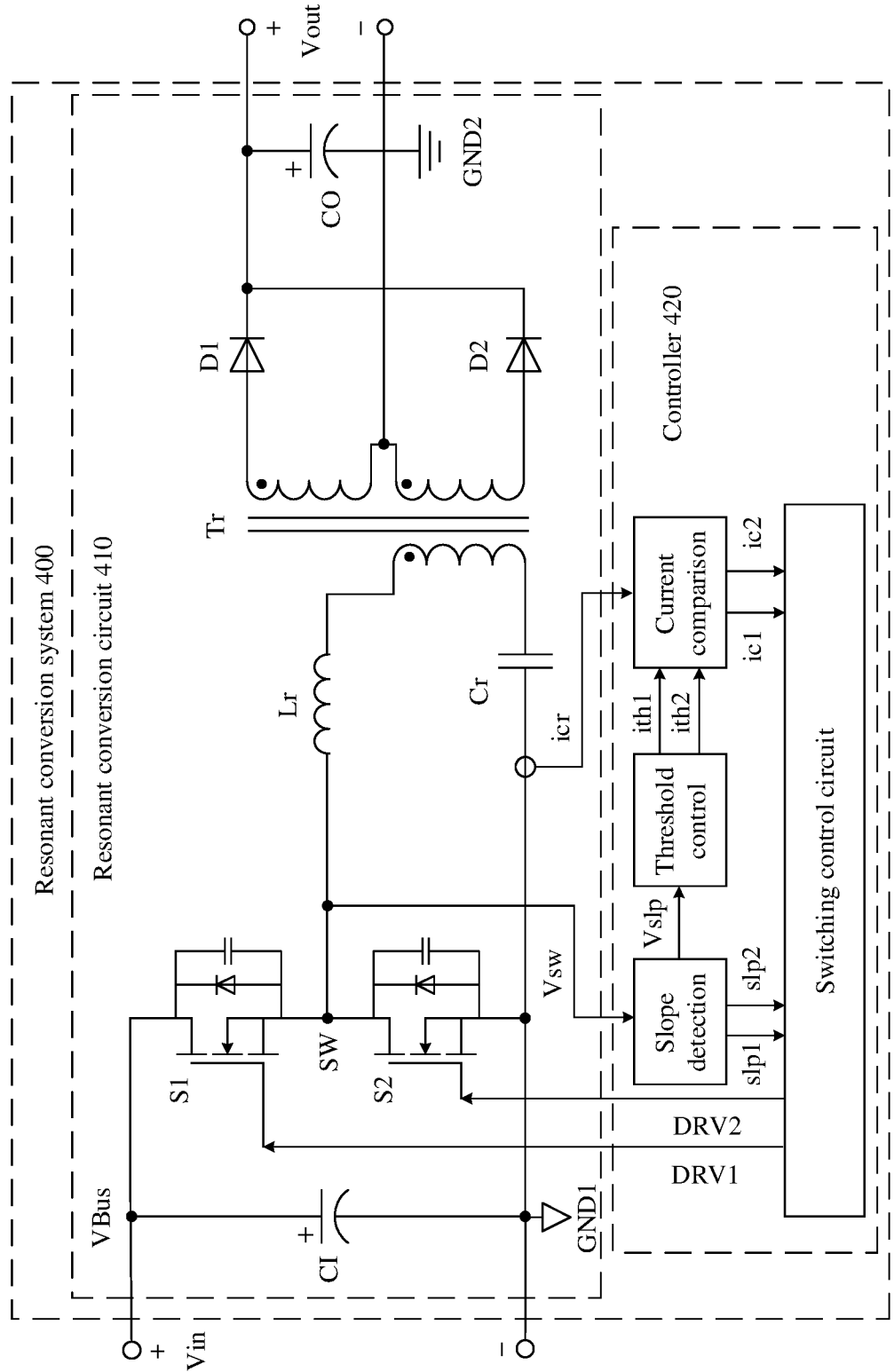
FIG. 8 is another schematic diagram of a structure of a resonant conversion system according to an embodiment of this application.

FIG. 8 is another schematic diagram of a structure of a resonant conversion system according to an embodiment of this application. As shown in FIG. 8, a resonant conversion system 400 includes a resonant conversion circuit 410 and a controller 420. A structure of the resonant conversion system 400 is basically the same as the structure of the resonant conversion system 300 shown in FIG. 4, and details are not described herein again.

Figure 9:
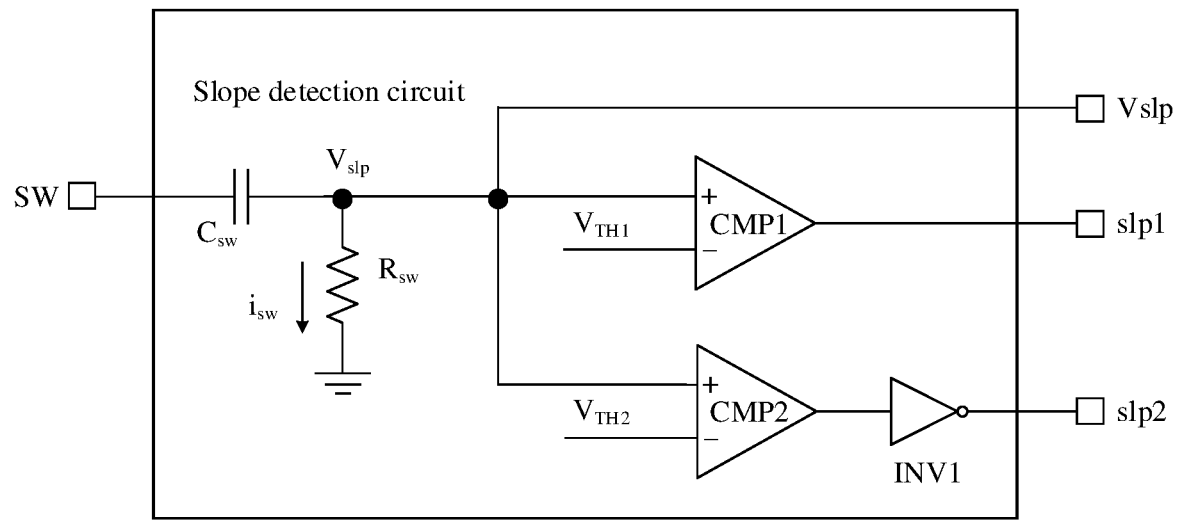
FIG. 9 is another schematic diagram of a structure of a slope detection circuit according to an embodiment of this application.

In this embodiment, the controller may detect a bridge arm midpoint voltage through a slope detection circuit, and adaptively adjust a current threshold through a threshold control circuit based on a variation amplitude of the bridge arm midpoint voltage. Therefore, as shown in FIG. 9, in this embodiment, the slope detection circuit no longer transmits signals slp1 and slp2 to the threshold control circuit, but only provides the signals to a switching control circuit for dead time control, and needs to output a signal Vslp to a threshold control module for determining ith1 and ith2. A current comparison circuit is the same as the current comparison circuit in the foregoing embodiment. For details, refer to the description in FIG. 6(a) and FIG. 6(b).

Figure 10:
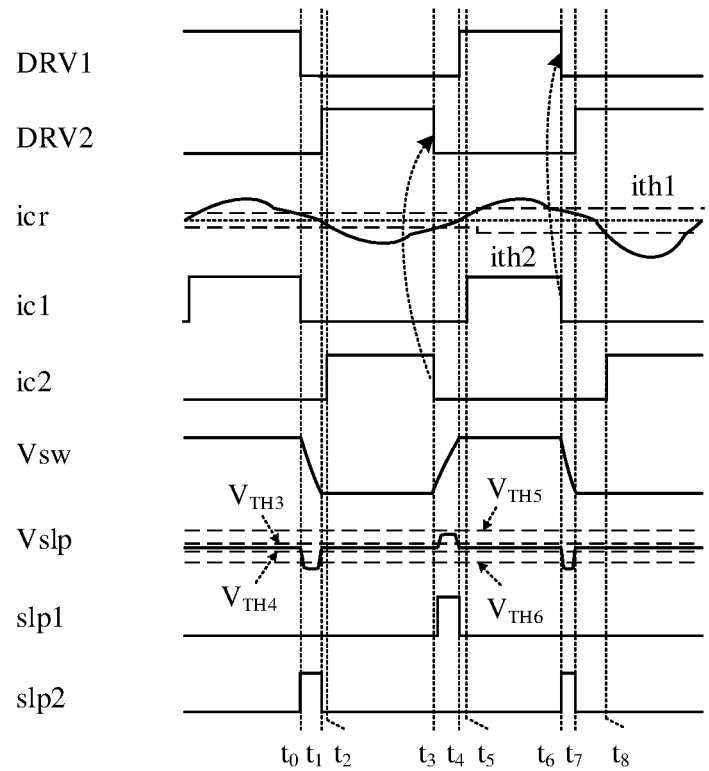
FIG. 10 is another waveform diagram of a threshold control circuit and a switching control circuit according to an embodiment of this application.

FIG. 10 is a waveform diagram of a threshold control circuit and a switching control circuit according to an embodiment of this application. As shown in FIG. 10, slp1 and slp2 are also obtained by comparing Vslp with slope thresholds $V_{TH1}$ and $V_{TH2}$, but are only used for dead region control. For example, at a moment $t_1$ in the figure, slp2 changes from 1 to 0, indicating that a voltage $V_{SW}$ decreases from Vin to 0. In this case, the dead time ends, and S2 may be turned on.

It should be understood that, similar to the foregoing embodiment, a first current threshold ith1 and a second current threshold ith2 are obtained by adjusting a first initial current threshold and a second initial current threshold determined by the threshold control circuit. The first initial current threshold and the first initial current threshold are preset values designed based on a circuit.

It should be further understood that a manner of determining slope thresholds $V_{TH3}$ and $V_{TH4}$ is not limited in this embodiment of this application. For example, a manner such as actual testing, analog simulation, or theoretical calculation may be used. In a possible implementation, dvsw/dt may be obtained based on a magnitude of a resonant current in combination with a resonant capacitor, and values of the thresholds $V_{TH3}$ and $V_{TH4}$ may be obtained based on a slope sampling resistance-capacitance parameter, where $V_{TH4}$ is less than $V_{TH3}$, and preferably $V_{TH3}$ may be a positive value and $V_{TH4}$ may be a negative value.

In this embodiment, adaptive adjustment of the current thresholds ith1 and ith2 is controlled by a voltage amplitude of Vslp and the thresholds $V_{TH3}$ and $V_{TH4}$. It can be learned from the foregoing formula (3) that, at a moment when a switch is turned off, a larger icr causes a faster Vsw change speed and a larger voltage amplitude of Vslp. In a period from t3 to t4 shown in FIG. 10, Vslp is lower than $V_{TH3}$, indicating that Vsw changes too slowly, so that a gain region may not be fully utilized. Therefore, the current thresholds ith1 and ith2 (absolute values) may be increased. When icr is lower than the threshold ith1 at a moment t6, the switch is turned off. Because ith1 is increased, Vsw changes faster, and the Vslp voltage is increased until the Vslp voltage is greater than the threshold $V_{TH3}$ (an absolute value). In this way, the system may operate in a state close to the capacitive mode, thereby maximizing the use of the gain region. Similarly, if the Vslp voltage is greater than another threshold (for example, $V_{TH5}$ or $V_{TH6}$), $V_{SW}$ changes too fast, which may cause the system to enter the capacitive mode, and is not conducive to implementing zero voltage switching of the switch. Therefore, the current thresholds ith1 and ith2 (absolute values) may be decreased. After the current thresholds ith1 and ith2 (absolute values) are decreased, Vsw changes slower, so that the system may continuously operate in the inductive mode to satisfy the zero voltage switching of the switch.

According to the technical solution of this application, the controller may detect the bridge arm midpoint voltage through the slope detection circuit, adaptively adjust the current threshold through the threshold control circuit based on the bridge arm midpoint voltage, and finally control on/off of the switch through the current comparison circuit, to restrict the resonant conversion system from entering the capacitive region. In this way, the system may operate close to the capacitive region, to implement zero voltage switching and maximize the use of the gain region.

Figure 11:
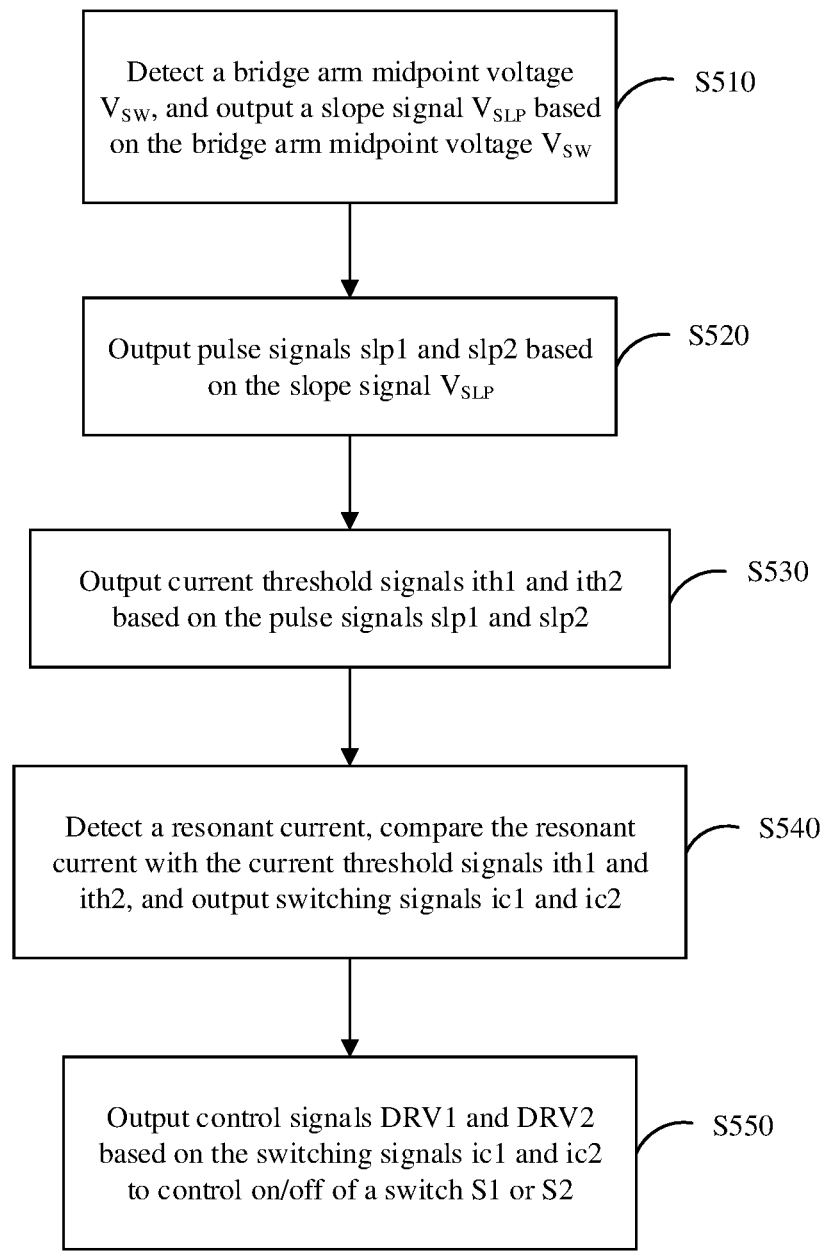
FIG. 11 is a schematic flowchart of a method of controlling a resonant conversion system according to an embodiment of this application.

FIG. 11 is a schematic flowchart of a method of controlling a resonant system according to an embodiment of this application.

In this embodiment of this application, a controller may include a slope detection circuit, a threshold control circuit, a current comparison circuit, and a switching control circuit. To facilitate a clearer understanding of the technical solution of this application, the following separately describes actions of each part. However, the description should not be used as a limitation on the technical solution of this application. The steps or operations performed by the slope detection circuit, the threshold control circuit, the current comparison circuit, and the switching control circuit may all be performed by the controller.

S510: The slope detection circuit detects a bridge arm midpoint voltage $V_{SW}$, and outputs a slope signal $V_{SLP}$ based on the bridge arm midpoint voltage $V_{SW}$.

Specifically, the slope detection circuit may include a detection capacitor Csw and a detection resistor Rsw. A first end of the detection capacitor Csw is configured to receive the bridge arm midpoint voltage Vsw, a second end of the detection capacitor Csw is connected to a first end of the detection resistor Rsw, and a second end of the detection resistor Rsw is grounded, and the first end of the detection resistor Rsw is configured to output the slope signal $V_{SLP}$.

After obtaining the slope signal $V_{SLP}$, the slope detection circuit may perform step S520. To be specific, the slope detection circuit outputs pulse signals slp1 and slp2 based on the slope signal $V_{SLP}$.

The slope detection circuit further includes a first comparator CMP1, a second comparator CMP2, and a first NOT gate INV1. A first input end and a second input end of the first comparator CMP1 are configured to receive the slope signal $V_{SLP}$ and a signal of a first slope threshold $V_{TH1}$ respectively, and an output end of the first comparator CMP1 is configured to output a first pulse signal slp1. A first input end and a second input end of the second comparator CMP2 are configured to receive the slope signal $V_{SLP}$ and a signal of a second slope threshold $V_{TH2}$ respectively, an output end of the second comparator CMP2 is connected to an input end of the first NOT gate INV1, and an output end of the first NOT gate INV1 is configured to output a second pulse signal slp2.

In this embodiment of this application, a manner of determining slope thresholds $V_{TH1}$ and $V_{TH2}$ may be determined in a plurality of manners, such as actual testing, analog simulation, or theoretical calculation. In a possible implementation, dvsw/dt may be obtained based on a magnitude of a resonant current in combination with a resonant capacitor, and values of the thresholds $V_{TH1}$ and $V_{TH2}$ may be obtained based on a slope sampling resistance-capacitance parameter, where $V_{TH2}$ is less than $V_{TH1}$, and preferably $V_{TH1}$ may be a positive value and $V_{TH2}$ may be a negative value.

The threshold control circuit may receive the first pulse signal slp1 and the second pulse signal slp2 output by the slope detection circuit, and perform step S530 to output current threshold signals ith1 and ith2 based on the pulse signals slp1 and slp2.

Specifically, a first current threshold ith1 and a second current threshold ith2 are obtained by adjusting a first initial current threshold and a second initial current threshold determined by the threshold control circuit. The first initial current threshold and the second initial current threshold are preset values designed based on a circuit.

Preferably, the first initial current threshold may be a positive value, and the second initial current threshold may be a negative value. With reference to the foregoing manners of determining $V_{TH1}$ and $V_{TH2}$, the first initial current threshold and the second initial current threshold may be determined in a manner such as actual testing, analog simulation, or theoretical calculation.

The threshold control circuit compares duration tslp1 indicated by a pulse length of the first pulse signal with a first time threshold Tth1, and when the duration tslp1 indicated by the pulse length of the first pulse signal is greater than the first time threshold Tth1, the threshold control circuit decreases the first initial current threshold to obtain the first current threshold ith1, or when the duration tslp1 indicated by the pulse length of the first pulse signal is less than the first time threshold Tth1, the threshold control circuit increases the first initial current threshold to obtain the first current threshold ith1.

The time threshold Tth1 is a fixed preset value, and may be determined in a manner such as actual testing, analog simulation, or theoretical calculation. A manner of determining the time threshold Tth1 is not limited in this application. The time threshold Tth2 in the following is similar, and details are not described herein again.

Correspondingly, the threshold control circuit compares duration tslp2 indicated by a pulse length of the second pulse signal with a second time threshold Tth2, and when the duration tslp2 indicated by the pulse length of the second pulse signal is greater than the second time threshold Tth2 the threshold control circuit increases the second initial current threshold to obtain the second current threshold ith2, or when the duration tslp2 indicated by the pulse length of the second pulse signal is less than the second time threshold Tth2, the threshold control circuit decreases the second initial current threshold to obtain the second current threshold ith2.

After the threshold control circuit outputs the first current threshold ith1 and the second current threshold ith2, the current comparison circuit may receive the first current threshold ith1 and the second current threshold ith2, and perform step S540 to detect the resonant current, compare the resonant current with the first current threshold ith1 and the second current threshold ith2, and output switching signals ic1 and ic2.

Specifically, the current comparison circuit may include a third comparator CMP3, a fourth comparator CMP4, and a second NOT gate INV2. A first input end and a second input end of the third comparator CMP3 are configured to receive the resonant current icr and the first current threshold ith1 respectively, and an output end of the third comparator CMP3 is configured to output the first switching signal ic1. A first input end and a second input end of the fourth comparator CMP4 are configured to receive the resonant current icr and the second current threshold ith2 respectively, an output end of the fourth comparator CMP4 is connected to an input end of the second NOT gate INV2, and an output end of the second NOT gate INV2 is configured to output the second switching signal ic2.

S550: The switching control circuit outputs a control signal DRV1 to the switch S1 and outputs a control signal DRV2 to the switch S2 based on the first switching signal ic1 and the second switching signal ic2, to control on/off of the switches S1 and S2.

According to the technical solution of this application, the resonant controller may detect the bridge arm midpoint voltage through the slope detection circuit, adaptively adjust the current threshold through the threshold control circuit based on the bridge arm midpoint voltage, and finally control on/off of the switch through the current comparison circuit, to restrict the resonant conversion system from entering the capacitive region. In this way, the system may continuously operate in the inductive region, to implement zero voltage switching and maximize the use of a gain region.

Figure 12:
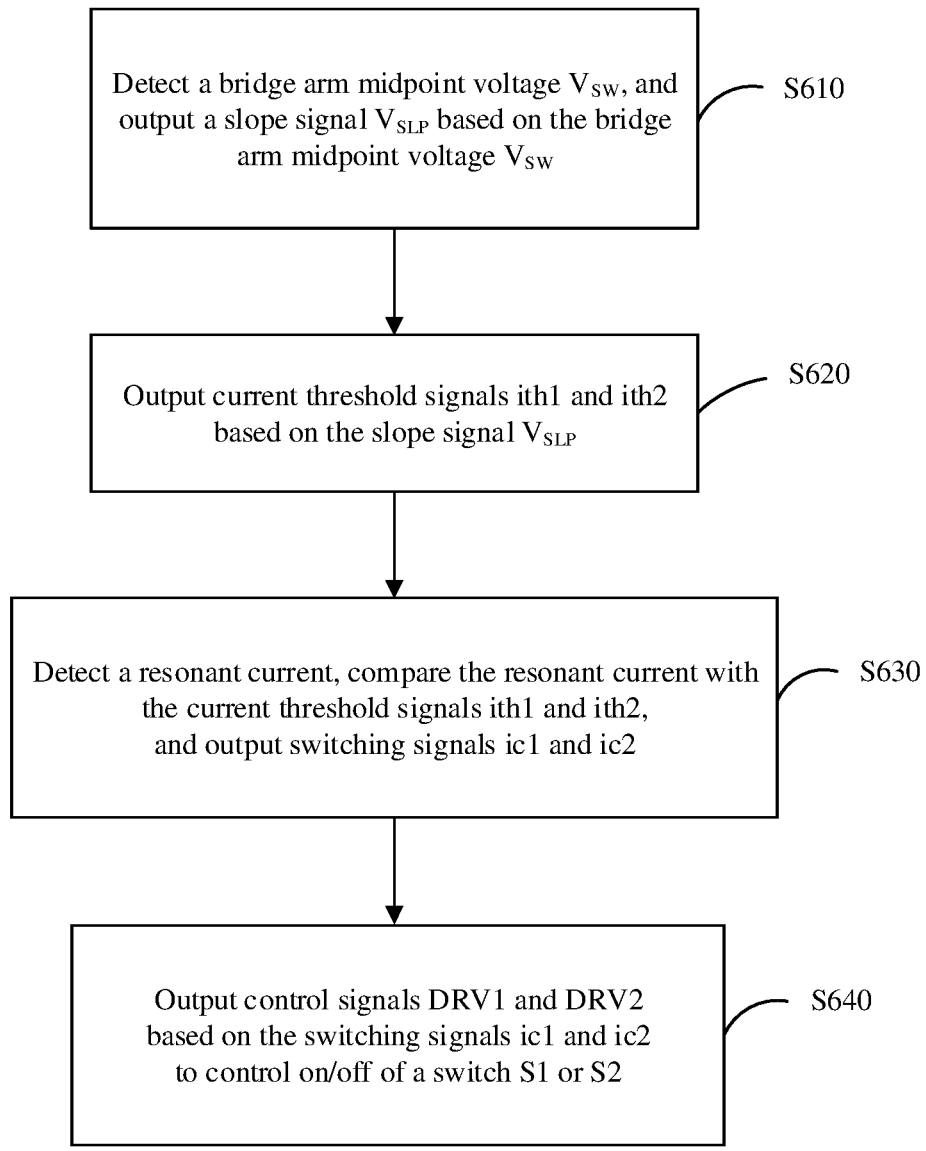
FIG. 12 is another schematic flowchart of a method of controlling a resonant conversion system according to an embodiment of this application.

FIG. 12 is another schematic flowchart of a method of controlling a resonant system according to an embodiment of this application.

In this embodiment of this application, a controller may include a slope detection circuit, a threshold control circuit, a current comparison circuit, and a switching control circuit. To facilitate a clearer understanding of the technical solution of this application, the following separately describes actions of each part. However, the description should not be used as a limitation on the technical solution of this application. The steps or operations performed by the slope detection circuit, the threshold control circuit, the current comparison circuit, and the switching control circuit may all be performed by the controller.

In this embodiment, the resonant controller may detect a bridge arm midpoint voltage through the slope detection circuit, and adaptively adjust a current threshold through the threshold control circuit based on a variation amplitude of the bridge arm midpoint voltage. Therefore, in this embodiment, the slope detection circuit no longer transmits signals slp1 and slp2 to the threshold control circuit, but needs to output a signal Vslp to a threshold control module for determining ith1 and ith2.

S610: This step is consistent with step S510 shown in FIG. 11. For details, refer to the description in FIG. 11. Details are not described herein again.

S620: The threshold control circuit outputs current threshold signals ith1 and ith2 based on the slope signal Vslp.

Specifically, a first current threshold ith1 and a second current threshold ith2 are obtained by adjusting a first initial current threshold and a second initial current threshold determined by the threshold control circuit. The first initial current threshold and the second initial current threshold are preset values designed based on a circuit.

Preferably, the first initial current threshold may be a positive value, and the second initial current threshold may be a negative value. With reference to the foregoing manners of determining $V_{TH1}$ and $V_{TH2}$, the first initial current threshold and the second initial current threshold may be determined in a manner such as actual testing, analog simulation, or theoretical calculation.

The threshold control circuit compares the slope signal $V_{SLP}$ with a third slope threshold $V_{TH3}$, and when the slope signal $V_{SLP}$ is greater than the third slope threshold $V_{TH3}$, the threshold control circuit decreases the first initial current threshold to obtain the first current threshold ith1, or when the slope signal $V_{SLP}$ is less than the third slope threshold $V_{TH3}$, the threshold control circuit increases the first initial current threshold to obtain the first current threshold ith1.

Correspondingly, the threshold control circuit compares the slope signal $V_{SLP}$ with a fourth slope threshold $V_{TH4}$, and when the slope signal $V_{SLP}$ is greater than the fourth slope threshold $V_{TH4}$, the threshold control circuit increases the second initial current threshold to obtain the second current threshold ith2, or when the slope signal $V_{SLP}$ is less than the fourth slope threshold $V_{TH4}$, the threshold control circuit decreases the second initial current threshold to obtain the second current threshold ith2.

In this embodiment of this application, a manner of determining slope thresholds $V_{TH3}$ and $V_{TH4}$ may be determined in a plurality of manners, such as actual testing, analog simulation, or theoretical calculation. In a possible implementation, a determining manner may be the same as the method of determining $V_{TH1}$ and $V_{TH2}$. Specifically, dvsw/dt may be obtained based on a magnitude of a resonant current in combination with a resonant capacitor, and values of the thresholds $V_{TH3}$ and $V_{TH4}$ may be obtained based on a slope sampling resistance-capacitance parameter, where $V_{TH4}$ is less than $V_{TH3}$, and optionally $V_{TH3}$ may be a positive value and $V_{TH4}$ may be a negative value.

After obtaining the first current threshold ith1 and the second current threshold ith2, the current comparison circuit may perform step S630. This step is the same as step S540 in FIG. 11. Specifically, the current comparison circuit may detect the resonant current, compare the resonant current with the current threshold signals ith1 and ith2, and output switching signals ic1 and ic2. Therefore, a switching control circuit may continue to perform step S640. This step is the same as step S550 in FIG. 11, and details are not described herein again.

According to the technical solution of this application, the resonant controller may detect the bridge arm midpoint voltage through the slope detection circuit, adaptively adjust the current threshold through the threshold control circuit based on the bridge arm midpoint voltage, and finally control on/off of the switch through the current comparison circuit, to restrict the resonant conversion system from entering the capacitive region. In this way, the system may continuously operate in the inductive region, to implement zero voltage switching and maximize the use of a gain region.

Figure 13:
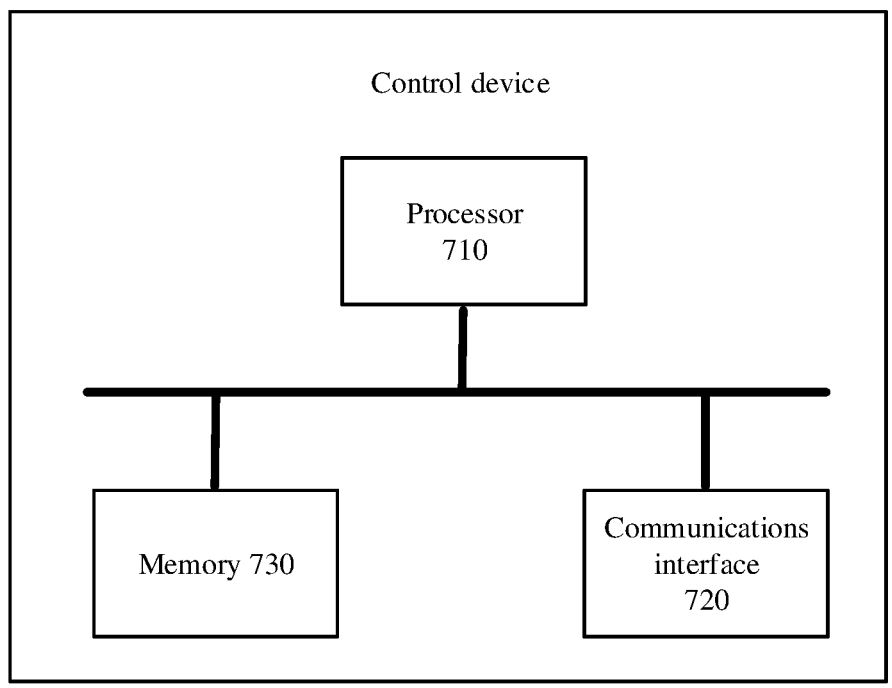
FIG. 13 is a schematic block diagram of a control device according to an embodiment of this application.

FIG. 13 is a schematic block diagram of a structure of a control device according to an embodiment of this application. The control device includes a processor 710 and a communications interface 720. Optionally, the control device may further include a memory 730. Optionally, the memory 730 may be included in the processor 710. The processor 710, the communications interface 720, and the memory 730 communicate with each other through an internal connection path. The memory 730 is configured to store instructions, and the processor 710 is configured to execute the instructions stored in the memory 730, to implement the control method provided in this embodiment of this application.

Optionally, the control device may be configured to perform functions of the controller 320 in FIG. 4 or the controller 420 in FIG. 8, where the controller 320 and the controller 420 each include a slope detection circuit, a threshold control circuit, a current comparison circuit, and a switching control circuit.

Optionally, the control device may be further configured to perform the control method shown in FIG. 11 or FIG. 12.

Terms such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an execution thread, a program, and/or a computer. As shown in figures, both a computing device and an application that runs on a computing device may be components. One or more components may reside within a process and/or an execution thread, and a component may be located on one computer and/or distributed between two or more computers. In addition, these components may be executed from various computer-readable media that store various data structures. The components may communicate through a local and/or remote process based on, for example, a signal having one or more data packets (for example, data from two components interacting with another component between local systems, distributed systems, and/or across a network such as the internet interacting with other systems by using a signal).

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in another manner. For example, the described apparatus embodiment is merely an example. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, that is, may be located in one position, or may be distributed on a plurality of network units. Some or all of the units may be selected depending on actual requirements to achieve the objectives of the solutions in the embodiments.

In addition, functional units in embodiments of this application may be integrated into one processing unit, each of the units may exist alone physically, or two or more units are integrated into one unit.

When the functions are implemented in the form of a software functional unit and sold or used as an independent product, the functions may be stored in a computer-readable storage medium. Based on this understanding, the technical solutions of this application essentially, or the part contributing to the prior art, or some of the technical solutions may be implemented in a form of a software product. The computer software product is stored in a storage medium, and includes several instructions for instructing a computer device (which may be, for example, a personal computer, a server, or a network device) to perform all or some of the steps of the methods described in embodiments of this application. The storage medium includes: any medium that can store program code, such as a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A resonant conversion system, comprising:
a controller; and
a resonant conversion circuit comprising a high frequency chopper circuit, a resonant cavity, a transformer, and a rectification filter network, wherein the high frequency chopper circuit comprises switches S1 and S2, the controller is configured to control on/off of the switches S1 and S2 to convert a direct current voltage input to the high frequency chopper circuit into a high frequency square wave, the resonant cavity and the transformer are configured to receive the high frequency square wave and couple electrical energy from a primary side of the transformer to a secondary side, and the rectification filter network is configured to convert an alternating current voltage coupled to the secondary side of the transformer into a direct current voltage; and
the controller is further configured to:
detect a bridge arm midpoint voltage $V_{SW}$, and determine a first electrical signal based on the bridge arm midpoint voltage $V_{SW}$, wherein the bridge arm midpoint voltage $V_{SW}$ is a voltage of a bridge arm midpoint connected to the switches S1 and S2, and the first electrical signal has an association relationship with a slope of the bridge arm midpoint voltage $V_{SW}$;
determine a current threshold signal based on the first electrical signal, wherein the current threshold signal is used to indicate a current threshold;
detect a resonant current on the primary side of the transformer, and compare the resonant current with the current threshold signal to determine a second electrical signal, wherein the second electrical signal is used to indicate a comparison result; and
control on/off of the switch S1 or S2 based on the second electrical signal, so that the system operates in an inductive mode.

2. The system according to claim 1, wherein the first electrical signal comprises a first pulse signal slp1 and a second pulse signal slp2, and the controller is specifically configured to:
detect the bridge arm midpoint voltage $V_{SW}$, and determine a slope signal $V_{SLP}$ based on the bridge arm midpoint voltage $V_{SW}$, wherein the slope signal $V_{SLP}$ indicates the slope of the bridge arm midpoint voltage $V_{SW}$;

determine the first pulse signal slp1 based on the slope signal $V_{SLP}$ and a first slope threshold $V_{TH1}$, wherein a pulse length of the first pulse signal slp1 is used to indicate duration tslp1 in which the slope signal $V_{SLP}$ is greater than the first slope threshold $V_{TH1}$; and determine the second pulse signal slp2 based on the slope signal $V_{SLP}$ and a second slope threshold $V_{TH2}$, wherein a pulse length of the second pulse signal slp2 is used to indicate duration tslp2 in which the slope signal $V_{SLP}$ is less than the second slope threshold $V_{TH2}$, and the second slope threshold $V_{TH2}$ is less than the first slope threshold $V_{TH1}$.

3. The system according to claim 2, wherein the current threshold signal comprises a first current threshold signal used to indicate a first current threshold ith1 and a second current threshold signal used to indicate a second current threshold ith2, and the controller is further configured to:

determine the first current threshold signal and the second current threshold signal based on the first pulse signal slp1 and the second pulse signal slp2, wherein the controller is specifically configured to:

determine a first initial current threshold and a second initial current threshold, wherein the first initial current threshold is a positive value, and the second initial current threshold is a negative value;

compare the duration tslp1 indicated by the pulse length of the first pulse signal slp1 with a first time threshold Tth1, and when the duration tslp1 indicated by the pulse length of the first pulse signal slp1 is greater than the first time threshold Tth1, decrease the first initial current threshold to obtain the first current threshold ith1, or when the duration tslp1 indicated by the pulse length of the first pulse signal slp1 is less than the first time threshold Tth1, increase the first initial current threshold to obtain the first current threshold ith1; and compare the duration tslp2 indicated by the pulse length of the second pulse signal slp2 with a second time threshold Tth2, and when the duration tslp2 indicated by the pulse length of the second pulse signal slp2 is greater than the second time threshold Tth2, increase the second initial current threshold to obtain the second current threshold ith2, or when the duration tslp2 indicated by the pulse length of the second pulse signal slp2 is less than the second time threshold Tth2, decrease the second initial current threshold to obtain the second current threshold ith2.

4. The system according to claim 1, wherein the first electrical signal is a slope signal $V_{SLP}$, the slope signal $V_{SLP}$ indicates the slope of the bridge arm midpoint voltage $V_{SW}$, and the controller is specifically configured to:

detect the bridge arm midpoint voltage $V_{SW}$, and determine the slope signal $V_{SLP}$ based on the bridge arm midpoint voltage $V_{SW}$.

5. The system according to claim 4, wherein the current threshold signal comprises a first current threshold signal used to indicate a first current threshold ith1 and a second current threshold signal used to indicate a second current threshold ith2, and the controller is further configured to:

determine the first current threshold signal and the second current threshold signal based on the slope signal $V_{SLP}$, wherein the controller is specifically configured to:

determine a first initial current threshold and a second initial current threshold, wherein the first initial current threshold is a positive value, and the second initial current threshold is a negative value;

compare the slope signal $V_{SLP}$ with a third slope threshold $V_{TH3}$, and when the slope signal $V_{SLP}$ is greater than the third slope threshold $V_{TH3}$, decrease the first initial current threshold to obtain the first current threshold ith1, or when the slope signal $V_{SLP}$ is less than the third slope threshold $V_{TH3}$, increase the first initial current threshold to obtain the first current threshold ith1; and compare the slope signal $V_{SLP}$ with a fourth slope threshold $V_{TH4}$, and when the slope signal $V_{SLP}$ is greater than the fourth slope threshold $V_{TH4}$, increase the second initial current threshold to obtain the second current threshold ith2, or when the slope signal $V_{SLP}$ is less than the fourth slope threshold $V_{TH4}$, decrease the second initial current threshold to obtain the second current threshold ith2, wherein the fourth slope threshold $V_{TH4}$ is less than the third slope threshold $V_{TH3}$.

6. The system according to claim 1, wherein the second electrical signal comprises a first switching signal ic1 and a second switching signal ic2, and the controller is further configured to:

detect the resonant current icr on the primary side of the transformer; and determine the first switching signal ic1 and the second switching signal ic2 based on the resonant current icr and the current threshold signal, wherein the current threshold signal comprises the first current threshold signal used to indicate the first current threshold ith1 and the second current threshold signal used to indicate the second current threshold ith2, and the controller is specifically configured to:

compare the resonant current icr with the first current threshold ith1, and when the resonant current icr is greater than the first current threshold ith1, determine that the first switching signal ic1 is used to indicate to turn on the switch S1, or when the resonant current icr is less than the first current threshold ith1, determine that the first switching signal ic1 is used to indicate to turn off the switch S1; and compare the resonant current icr with the second current threshold ith2, and when the resonant current icr is greater than the second current threshold ith2, determine that the second switching signal ic2 is used to indicate to turn off the switch S2, or when the resonant current icr is less than the second current threshold ith2, determine that the second switching signal ic2 is used to indicate to turn on the switch S2.

7. The system according to claim 6, wherein the controller is specifically configured to:

determine a first control signal DR1 based on the first switching signal ic1, wherein the first control signal DRV1 is used to control on/off of the switch S1; and determine a second control signal DRV2 based on the second switching signal ic2, wherein the second control signal DRV2 is used to control on/off of the switch S2.

8. The system according to claim 1, wherein the controller comprises:

a slope detection circuit, a threshold control circuit, a current comparison circuit, and a switching control circuit.

9. The system according to claim 8, wherein the slope detection circuit comprises:

a detection capacitor Csw and a detection resistor Rsw, wherein a first end of the detection capacitor Csw is configured to receive the bridge arm midpoint voltage Vsw, a second end of the detection capacitor Csw is connected to a first end of the detection resistor Rsw, a second end of the detection resistor Rsw is grounded, and the first end of the detection resistor Rsw is configured to output the slope signal $V_{SLP}$.

10. The system according to claim 8, wherein the slope detection circuit further comprises a first comparator CMP1, a second comparator CMP2, and a first NOT gate INV1, wherein a first input end and a second input end of the first comparator CMP1 are configured to receive the slope signal $V_{SLP}$ and a signal of the first slope threshold $V_{TH1}$ respectively, and an output end of the first comparator CMP1 is configured to output the first pulse signal slp1; and a first input end and a second input end of the second comparator CMP2 are configured to receive the slope signal $V_{SLP}$ and a signal of the second slope threshold $V_{TH2}$ respectively, an output end of the second comparator CMP2 is connected to an input end of the first NOT gate INV1, and an output end of the first NOT gate INV1 is configured to output the second pulse signal slp2.

11. The system according to claim 8, wherein the current comparison circuit comprises:

a third comparator CMP3, a fourth comparator CMP4, and a second NOT gate INV2, wherein a first input end and a second input end of the third comparator CMP3 are configured to receive the resonant current icr and the first current threshold ith1 respectively, and an output end of the third comparator CMP3 is configured to output the first switching signal ic1; and a first input end and a second input end of the fourth comparator CMP4 are configured to receive the resonant current icr and the second current threshold ith2 respectively, an output end of the fourth comparator CMP4 is connected to an input end of the second NOT gate INV2, and an output end of the second NOT gate INV2 is configured to output the second switching signal ic2.

12. A method for controlling a resonant conversion system, wherein the resonant conversion system comprises:

a controller; and a resonant conversion circuit comprising a high frequency chopper circuit, a resonant cavity, a transformer, and a rectification filter network, wherein the high frequency chopper circuit comprises switches S1 and S2, the controller is configured to control on/off of the switches S1 and S2 to convert a direct current voltage input to the high frequency chopper circuit into a high frequency square wave, the resonant cavity and the transformer are configured to receive the high frequency square wave and couple electrical energy from a primary side of the transformer to a secondary side, and the rectification filter network is configured to convert an alternating current voltage coupled to the secondary side of the transformer into a direct current voltage; and the method comprises:

detecting, by the controller, a bridge arm midpoint voltage $V_{SW}$, and determining a first electrical signal based on the bridge arm midpoint voltage $V_{SW}$, wherein the bridge arm midpoint voltage $V_{SW}$ is a voltage of a bridge arm midpoint connected to the switches S1 and S2, and the first electrical signal has an association relationship with a slope of the bridge arm midpoint voltage $V_{SW}$;

determining, by the controller, a current threshold signal based on the first electrical signal, wherein the current threshold signal is used to indicate a current threshold;

detecting, by the controller, a resonant current on the primary side of the transformer, and comparing the resonant current with the current threshold signal to determine a second electrical signal, wherein the second electrical signal is used to indicate a comparison result; and controlling, by the controller, on/off of the switch S1 or S2 based on the second electrical signal, so that the system operates in an inductive mode.

13. The method according to claim 12, wherein the first electrical signal comprises a first pulse signal slp1 and a second pulse signal slp2; and the detecting, by the controller, a bridge arm midpoint voltage $V_{SW}$, and determining a first electrical signal based on the bridge arm midpoint voltage $V_{SW}$ comprises:

detecting, by the controller, the bridge arm midpoint voltage $V_{SW}$, and determining a slope signal $V_{SLP}$ based on the bridge arm midpoint voltage Vsw, wherein the slope signal $V_{SLP}$ indicates the slope of the bridge arm midpoint voltage $V_{SW}$;

determining, by the controller, the first pulse signal slp1 based on the slope signal $V_{SLP}$ and a first slope threshold $V_{TH1}$, wherein a pulse length of the first pulse signal slp1 is used to indicate duration tslp1 in which the slope signal $V_{SLP}$ is greater than the first slope threshold $V_{TH1}$; and determining, by the controller, the second pulse signal slp2 based on the slope signal $V_{SLP}$ and a second slope threshold $V_{TH2}$, wherein a pulse length of the second pulse signal slp2 is used to indicate duration tslp2 in which the slope signal $V_{SLP}$ is less than the second slope threshold $V_{TH2}$, and the second slope threshold $V_{TH2}$ is less than the first slope threshold $V_{TH1}$.

* * * * *